(12) United States Patent
Hirayama

(10) Patent No.: US 11,469,192 B2
(45) Date of Patent: Oct. 11, 2022

(54) SEMICONDUCTOR DEVICE CAPABLE OF REALIZING A WIDE BAND IMPEDANCE MATCHING

(71) Applicant: SUMITOMO ELECTRIC DEVICE INNOVATIONS, INC., Yokohama (JP)

(72) Inventor: Masahiro Hirayama, Yokohama (JP)

(73) Assignee: SUMITOMO ELECTRIC DEVICE INNOVATIONS, INC., Yokohama (JP)

( * ) Notice: Subject to any disclaimer, the term of this patent is extended or adjusted under 35 U.S.C. 154(b) by 136 days.

(21) Appl. No.: 16/977,855

(22) PCT Filed: Mar. 6, 2019

(86) PCT No.: PCT/JP2019/008935
§ 371 (c)(1),
(2) Date: Sep. 3, 2020

(87) PCT Pub. No.: WO2019/172332
PCT Pub. Date: Sep. 12, 2019

(65) Prior Publication Data
US 2021/0028132 A1    Jan. 28, 2021

(51) Int. Cl.
*H01L 23/66* (2006.01)
*H01L 23/498* (2006.01)
(Continued)

(52) U.S. Cl.
CPC ........ *H01L 23/66* (2013.01); *H01L 23/49838* (2013.01); *H01S 5/026* (2013.01);
(Continued)

(58) Field of Classification Search
CPC ....... H01L 23/64; H01L 23/642; H01L 23/66; H01L 2223/64; H01L 2223/66;
(Continued)

(56) References Cited

U.S. PATENT DOCUMENTS

2003/0183884 A1* 10/2003 Miyazawa .......... H01L 27/0805
257/E27.048
2004/0070811 A1* 4/2004 Matsushima ........... H01L 23/66
359/254
(Continued)

FOREIGN PATENT DOCUMENTS

| JP | 2004-253947 A | 9/2004 |
| JP | 2005-252251 A | 9/2005 |
| JP | 2005-278090 A | 10/2005 |

OTHER PUBLICATIONS

May 17, 2019 Written Opinion of the International Searching Authority issued in International Patent Application No. PCT/JP2019/008935.

*Primary Examiner* — Scott B Geyer
(74) *Attorney, Agent, or Firm* — Oliff PLC

(57) ABSTRACT

A 2nd signal line has impedance lower than impedance of a 1st signal line. A capacitor includes a 1st extension part and a 2nd extension part, a 1st ground part and a 2nd ground part. The 1st extension part and the 2nd extension part are connected to a 2nd signal line and are on an insulation substrate to extend along a longitudinal direction of the 2nd signal line. The 1st ground part and the 2nd ground part are at least a part of a ground pattern, and are between the 1st extension part and the 2nd extension part and the 2nd signal line, and between the 1st extension part and the 2nd extension part and an end part of the insulation substrate, to be electrically coupled with the 1st extension part and the 2nd extension part.

16 Claims, 23 Drawing Sheets

(51) Int. Cl.
*H01S 5/026* (2006.01)
*H01S 5/042* (2006.01)
*H01S 5/024* (2006.01)
*H01L 25/04* (2014.01)

(52) U.S. Cl.
CPC ...... *H01S 5/02469* (2013.01); *H01S 5/04256* (2019.08); *H01L 25/04* (2013.01); *H01L 2223/6627* (2013.01); *H01L 2223/6655* (2013.01); *H01L 2223/6661* (2013.01)

(58) Field of Classification Search
CPC ..... H01L 2223/6605; H01L 2223/6611; H01L 2223/6627; H01L 2223/6638; H01L 2223/6644; H01L 2223/6655; H01L 2223/6661; H01L 23/498; H01L 23/49838; H01L 23/49844; H01L 2223/49861; H01L 23/50; H01L 25/04; H01L 25/042; H01L 25/0655; H01L 25/072; H01L 25/0753; H01L 25/16; H01L 25/167; H01L 25/18; H01S 5/024–02492; H01S 5/022; H01S 5/0232; H01S 5/02325; H01S 5/02326; H01S 5/02345; H01S 5/0239; H01S 5/042; H01S 5/0425; H01S 5/04254; H01S 5/04256; H01S 5/04257

See application file for complete search history.

(56) References Cited

U.S. PATENT DOCUMENTS

| | | | |
|---|---|---|---|
| 2007/0047173 A1* | 3/2007 | Reid | H01G 5/18 257/E21.011 |
| 2007/0248363 A1* | 10/2007 | Kagaya | H01S 5/02325 385/2 |
| 2012/0235764 A1 | 9/2012 | Kang et al. | |
| 2017/0091647 A1 | 3/2017 | Abdo | |
| 2018/0054177 A1* | 2/2018 | Mudakatte | H01L 28/40 |
| 2019/0088642 A1* | 3/2019 | Canning | H01L 23/13 |

* cited by examiner

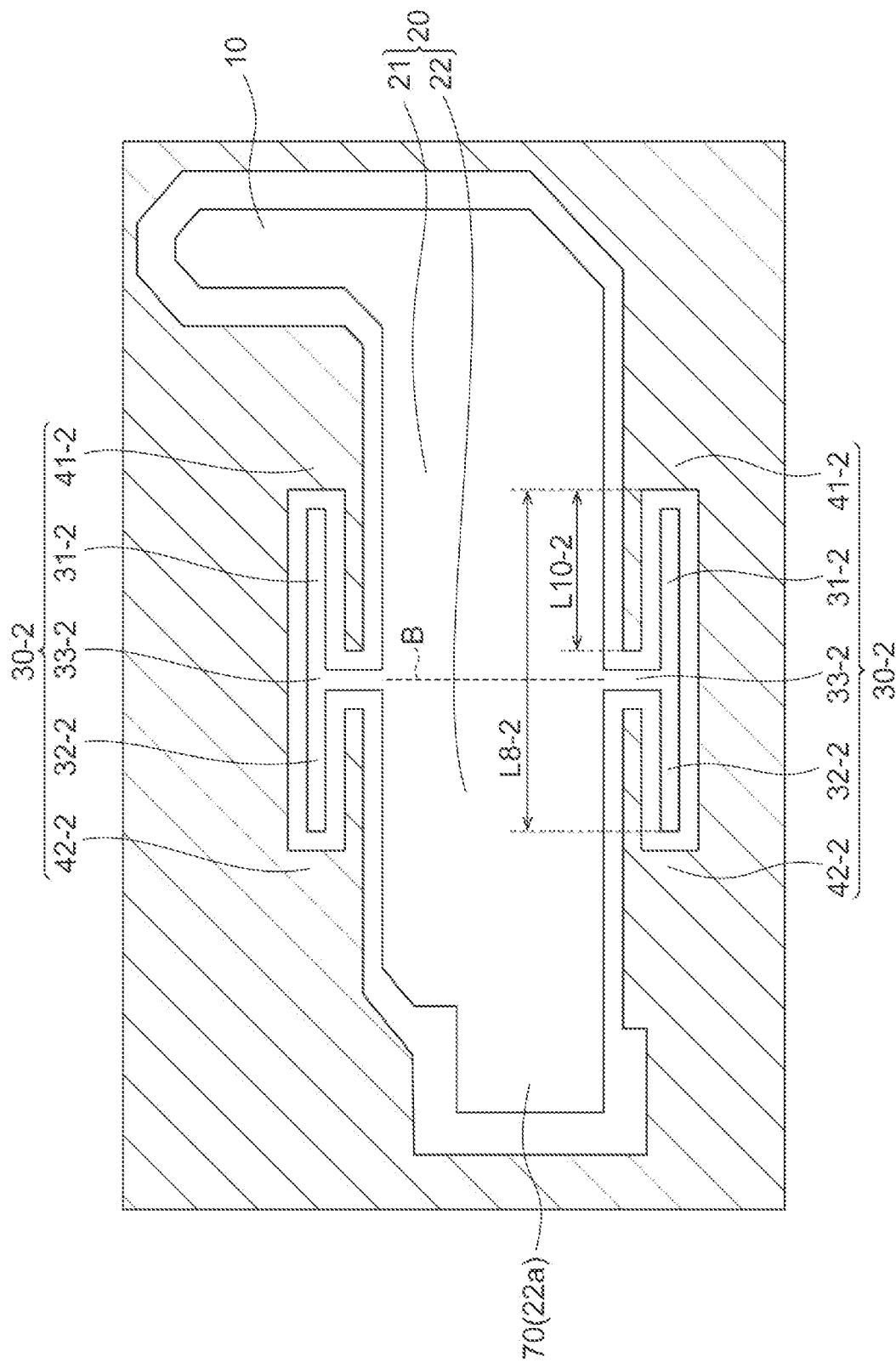

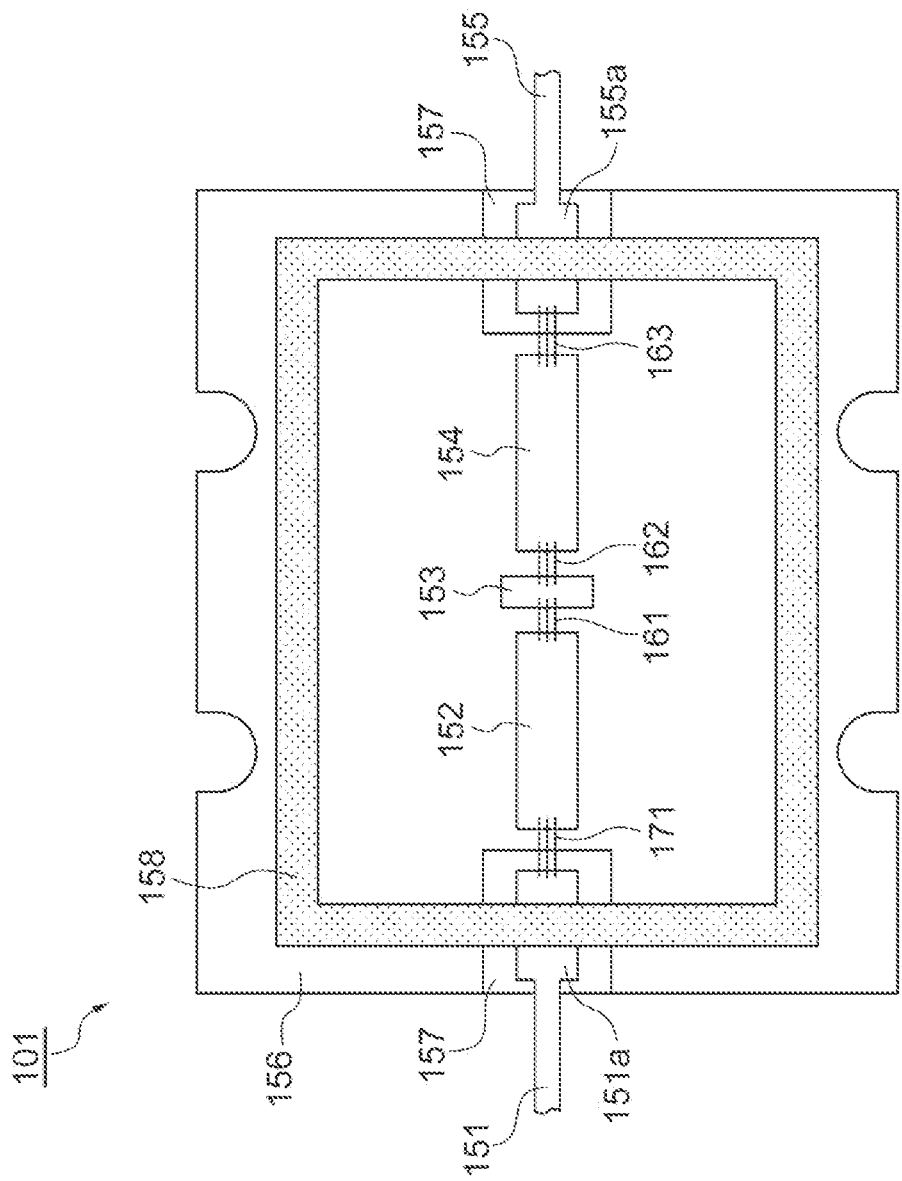

SEMICONDUCTOR DEVICE CAPABLE OF REALIZING A WIDE BAND IMPEDANCE MATCHING

TECHNICAL FIELD

The present disclosure relates to a semiconductor device. This application is based upon and claims the benefit of priority from Japanese Patent Application No. 2018-040896, filed on Mar. 7, 2018 and Japanese Patent Application No. 2018-167087, filed on Sep. 6, 2018, the entire contents of which are in-corporated herein by reference.

BACKGROUND ART

For example, PLT 1 discloses an optical transmission assembly including a semi-conductor light emitting element.

CITATION LIST

Patent Literature

[PLT 1] Japanese Unexamined Patent Application Publication No. 2005-252251

SUMMARY OF INVENTION

Technical Problem

Along with the progress of high speed and large capacitance, it is necessary to widen a frequency range of an electric signal input to a semiconductor element. However, up to now, a study for impedance matching in a wide band such as high frequencies up to 10 GHz, 20 GHz or higher has been insufficient.

Solution to Problem

The present disclosure aims to provide a semiconductor device capable of realizing a wide band impedance matching.

A semiconductor device according to an aspect of the present disclosure includes: an insulation substrate provided with a ground pattern having a reference potential; a semiconductor element provided on the insulation substrate; an input terminal provided on the insulation substrate and to which an electric signal to be supplied to the semi-conductor element is input; a 1st signal line electrically connected between the semi-conductor element and the input terminal, and is provided on the insulation substrate; a 2nd signal line electrically connected between the 1st signal line and the input terminal, and is connected to the 1st signal line and provided on the insulation substrate; and a capacitor connected to the 2nd signal line and provided on the insulation substrate. The 2nd signal line has impedance lower than impedance of the 1st signal line. The capacitor includes a 1st metal pattern provided on the insulation substrate so as to connect to the 2nd signal line and extend along a longitudinal direction of the 2nd signal line, and a 2nd metal pattern which is at least a part of the ground pattern, and is provided between the 1st metal pattern and the 2nd signal line and between the 1st metal pattern and an end part of the insulation substrate, so as to be electrically coupled with the 1st metal pattern.

Advantageous Effects of Invention

According to the present disclosure, a semiconductor device capable of realizing the wide band impedance matching is provided.

BRIEF DESCRIPTION OF DRAWINGS

FIG. 9 is a diagram illustrating a variation of FIG. 3.

FIG. 10 is a plan view illustrating a schematic configuration of a semiconductor device according to another embodiment.

DESCRIPTION OF EMBODIMENTS

Explanation of Embodiments of Present Disclosure

Figure 1:
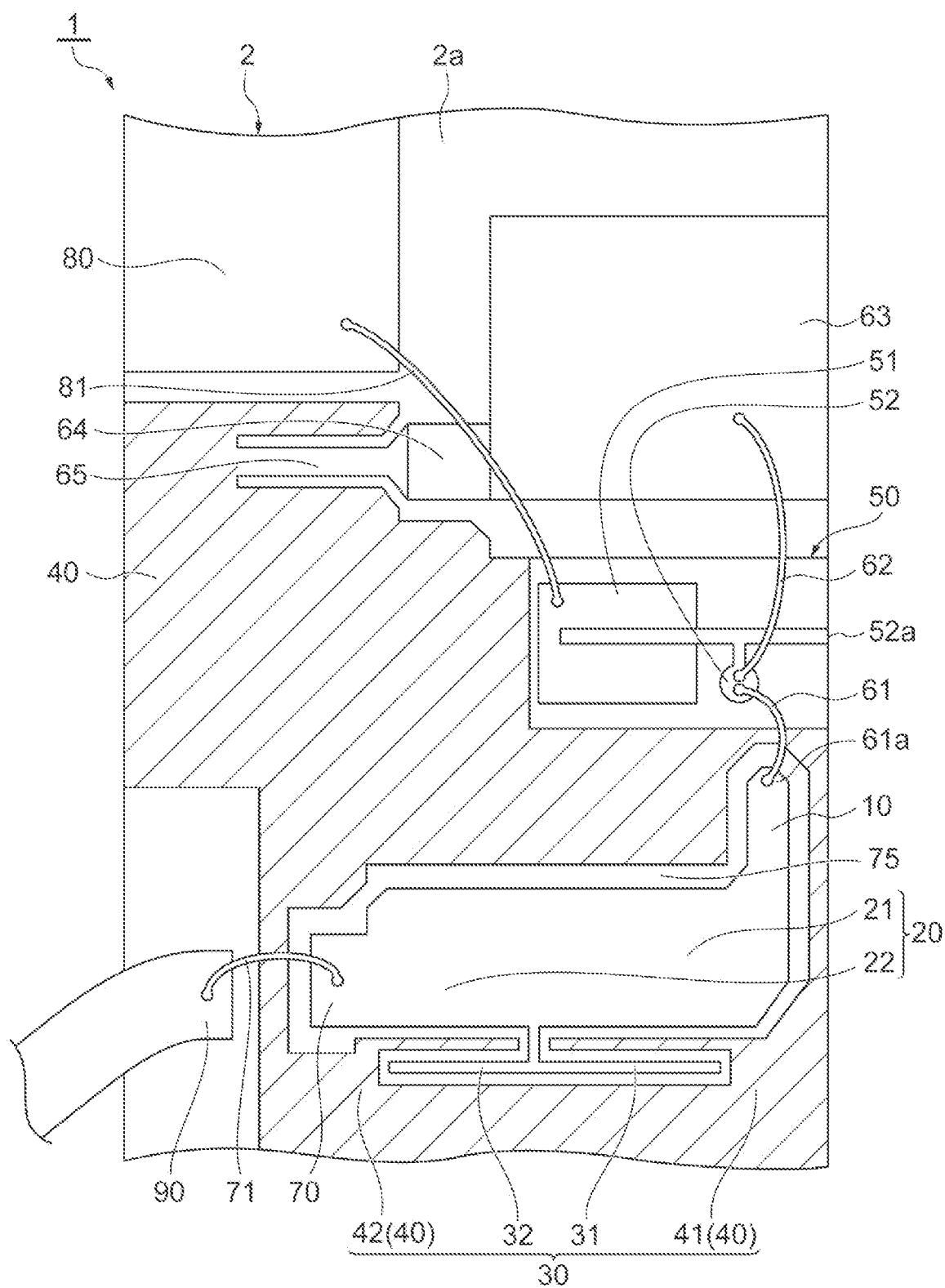
FIG. 1 is a plan view illustrating a schematic configuration of a semiconductor device according to an embodiment.

First, the content of the embodiments of the present disclosure will be described. A semiconductor device according to an embodiment includes an insulation substrate provided with a ground pattern having a reference potential, a semiconductor element provided on the insulation substrate, an input terminal provided on the insulation substrate and to which an electric signal to be supplied to the semiconductor element is input, a 1st signal line electrically connected between the semiconductor element and the input terminal, and is provided on the insulation substrate, a 2nd signal line electrically connected between the 1st signal line and the input terminal, and is connected to the 1st signal line and provided on the insulation substrate, and a capacitor connected to the 2nd signal line and provided on the insulation substrate. The 2nd signal line has impedance lower than impedance of the 1st signal line. The capacitor includes a 1st metal pattern provided on the insulation substrate so as to connect to the 2nd signal line and extend along the long direction of the 2nd signal line, and a 2nd metal pattern which is at least a part of the ground pattern, and is provided between the 1st metal pattern and the 2nd signal line and between the 1st metal pattern and the end part of the insulation substrate so as to be electrically coupled with the 1st metal pattern.

In the semiconductor device in the related art, a signal line having constant impedance is provided between the semiconductor element and the input terminal. On the other hand, in the semiconductor device described above, the 1st signal line, the 2nd signal line, and the capacitor are provided between the semiconductor element and the input terminal. The 2nd signal line has impedance lower than the impedance of the 1st signal line. As such, by providing two signal lines of the 1st signal line and the 2nd signal line having impedance different from each other, the impedance matching can be obtained up to a high frequency band compared to the semiconductor device in the related art. In addition, since the capacitor is connected to the 2nd signal line, the optimum impedance matching can be obtained up to the further higher frequency band.

In the 2nd metal pattern, a part positioned between the 2nd signal line and the 1st metal pattern may be provided to be electrically coupled with the 2nd signal line. In this way, it possible to give the capacitance to the 2nd signal line in a distributed manner using the electrical coupling between the 2nd metal pattern and the 2nd signal line.

The impedance of the 2nd signal line may be lower than 50 ohm. In this way, when the 1st signal line has impedance equal to or higher than 50 ohm, the 2nd signal line having a lower impedance can be obtained.

The 1st signal line may have a constant width in a longitudinal direction. This facilitates a desired impedance design because the 1st signal line can have a constant impedance in the longitudinal direction.

A connection part of the 1st signal line and the 2nd signal line may be bent. In this way, the overall length of the signal lines in one direction can be suppressed, and thus, it is possible to minimize the size of the semiconductor device.

The 1st signal line and the 2nd signal line may be connected in an L shape, one end of the 1st signal line may be connected to the semiconductor element, and an other end of the 1st signal line may be connected to the 2nd signal line, and the semiconductor element may be provided on the one end side of the 1st signal line, and the capacitor may be provided on the side opposite to the one end side of the 1st signal line across the 2nd signal line. In this way, since the capacitor is provided at a position relatively far from (not too close to) the semiconductor element and the 1st signal line, it is possible to suppress the influence on the electrical characteristics due to the interference between the capacitor and the semiconductor element and the 1st signal line.

The 1st signal line and the 2nd signal line may be coplanar lines using the ground pattern. In this way, for example, it is possible to easily create the 1st signal line and the 2nd signal line compared to a case where the 1st signal line and the 2nd signal line are microstrip lines.

The capacitor may be provided on both sides of the 2nd signal line along the 2nd signal line. In this way, it is possible to improve a degree of freedom of the space for providing the capacitor compared to a case where, for example, the capacitor is provided only on one side of the 2nd signal line.

DETAILS OF EMBODIMENTS OF PRESENT DISCLOSURE

Specific examples of a semiconductor device according to an embodiment of the present disclosure will be described below with reference to the drawings. The present disclosure is not limited to these examples but is intended to be indicated by the scope of the claims and includes all modifications within the scope and meaning equivalent to the scope of the claims. In the descriptions below, the same reference numerals will be given to the same elements even in the description of the drawings, and redundant explanation will be omitted.

FIG. 1 is a plan view (layout) illustrating a schematic configuration of a semiconductor device according to an embodiment.

A semiconductor device 1 includes an insulation substrate 2. Examples of materials of the insulation substrate 2 are ceramics (such as aluminum oxide or aluminum nitride). The relative dielectric constant of the insulation substrate 2 is, for example, 8.8. The thickness of the insulation substrate 2 is, for example, 750 μm (700 μm to 850 μm). The insulation substrate 2 includes a main surface 2a. A metal pattern and configuration elements of the semiconductor device 1 are provided on the main surface 2a. The metal pattern may be formed of gold, copper, or the like. The thickness of the metal pattern may be sufficiently thinner than the thickness of the insulation substrate 2. The thickness of the metal pattern is, for example, 3 μm (2 μm to 7 μm). In the metal pattern, a metal pattern having a reference potential (for example, 0 V) is illustrated as a ground pattern 40. In the figure, the ground pattern 40 is indicated by hatching. Hereinafter, in some cases, "on the main surface 2a of the insulation substrate 2" may be simply referred to as "on the insulation substrate 2".

The semiconductor device 1 includes a semiconductor element 50. The semiconductor element 50 is provided on the insulation substrate 2. The semiconductor element 50 is an optical semiconductor element or a high frequency semiconductor element. Examples of the optical semiconductor element are a laser (LD: Laser Diode) and an optical modulator. When the semiconductor element 50 is an optical semiconductor element, the semiconductor device 1 may be used as a transmitter optical sub-assembly (TOSA) or the like. Examples of the high frequency semiconductor element are a field effect transistor (FET), a bipolar transistor, and the like.

In this embodiment, an example of a case where the semiconductor element 50 is an electro-absorption modulator integrated laser (EML) diode will be described. In the semiconductor element 50, the laser and the modulator are integrated (as a chip). An electrode 51 for laser and an electrode 52 for modulator are shown in FIG. 1 as a part of the configuration elements of such a semiconductor element 50. The electrode 51 for laser is connected to a power supply terminal 80 via a wire 81 such that a power supply voltage can be supplied. The electrode 52 for modulator is connected to a 1st signal line 10 to be described later via the wire 61 and a bonding pattern 61a such that an electric signal can be supplied. The modulated laser light is emitted from an end face 52a of the semiconductor element 50. The electrode 52 for modulator is also connected to a capacitor 63 via a wire 62. A capacitor 63 is connected to the ground pattern 40 via a resistor 64 and a transmission line 65. The capacitor 63 and the resistor 64 function as a terminal circuit. The capacitor 63 connects the semiconductor element 50 and the resistor 64 in a high frequency manner. Only the resistor 64 can also function as the terminal circuit.

The semiconductor device 1 includes an input terminal 70. The input terminal 70 is provided on the insulation substrate 2 (for example, an end part on the insulation substrate 2). An electric signal is input to the input terminal 70. The electric signal is an electric signal to be supplied to the above-described semiconductor element 50. When the semiconductor element 50 is EML, the electric signal is a modulation signal. The electric signal is a wide band signal that may include frequency components having frequencies up to, for example, 10 GHz, 20 GHz or higher. The electric signal is supplied via a transmission line 90, for example. The transmission line 90 may be a 50 ohm line. The input terminal 70 is connected to a transmission line 90 via a wire 71. The input terminal 70 may be a part of a 2nd signal line 20 to be described later.

The semiconductor device 1 includes the 1st signal line 10. The 1st signal line 10 is electrically connected between the semiconductor element 50 and the input terminal 70 and is provided on the insulation substrate 2. The detailed configuration of the 1st signal line 10 will be described later with reference to FIG. 3. "Electrically connected" may include aspects in which the elements are directly connected to each other.

The semiconductor device 1 includes the 2nd signal line 20. The 2nd signal line 20 is electrically connected between the 1st signal line 10 and the input terminal 70 and is provided on the insulation substrate 2. The 2nd signal line 20 is (directly) connected to the 1st signal line 10. The 2nd signal line 20 has a lower impedance than impedance of the 1st signal line 10. The 2nd signal line 20 may include a 1st part 21 and a 2nd part 22. The 1st part 21 is a part connected to the 1st signal line 10. The 2nd part 22 is a part connected to the input terminal 70. The detailed configuration of the 2nd signal line 20 will be described later with reference to FIG. 3. The semiconductor device 1 includes a gap 75 between the 1st signal line 10 and the ground pattern, and between the 2nd signal line 20 and the ground pattern. The gap 75 is a region where the surface of the insulation substrate 2 is exposed.

The semiconductor device 1 includes a capacitor 30. The capacitor 30 is connected to the 2nd signal line 20. The capacitor 30 is provided on the insulation substrate 2. Specifically, the capacitor 30 is connected between the 2nd signal line 20 and the ground pattern 40. From a lumped constant perspective, the capacitor 30 is connected in parallel to the 2nd signal line 20 seen from the input terminal 70 or from the 1st signal line 10. The capacitor 30 is connected to a boundary part between the 1st part 21 and the 2nd part 22 of the 2nd signal line 20. The capacitor 30 is an inter-digital capacitor (IDC) formed by a metal pattern provided on the insulation substrate 2. The capacitor 30 is configured to include a metal pattern and a ground pattern provided to be electrically coupled with each other. Therefore, the capacitor 30 functions as a capacitor connected between the 2nd signal line 20 and the ground pattern 40. "Provided to be electrically coupled" means that the metal patterns are provided to be separated from each other such that capacitive coupling occurs between the metal patterns in a high frequency band (for example, the frequency band of the electric signal described above). The separation distance may be approximately several μm to several tens μm, for example.

The capacitor 30 includes a 1st extension part 31 and a 2nd extension part 32. The 1st extension part 31 and the 2nd extension part 32 are metal patterns (1st metal pattern) which are connected to the 2nd signal line 20 and provided on the insulation substrate 2 to extend along the longitudinal direction of the 2nd signal line 20.

The capacitor 30 includes a 1st ground part 41 and a 2nd ground part 42. The 1st ground part 41 and the 2nd ground part 42 are at least a part of the ground pattern 40 and are metal patterns (2nd metal pattern) positioned on both sides of the 1st extension part 31 and the 2nd extension part 32. The 1st ground part 41 may be provided on both sides of the 1st extension part 31 to be electrically coupled with at least the 1st extension part 31. In this example, the 1st ground part 41 is provided between the 1st extension part 31 and the 2nd signal line 20, and between the 1st extension part 31 and an end part of the insulation substrate 2. The 2nd ground part 42 may be provided on both sides of the 2nd extension part 32 to be electrically coupled with at least the 2nd extension part 32. In this example, the 2nd ground part 42 is provided between the 2nd extension part 32 and the 2nd signal line 20, and between the 2nd extension part 32 and the end part of the insulation substrate 2. The detailed configuration of the capacitor 30 will be described later with reference to FIG. 3.

Figure 2:
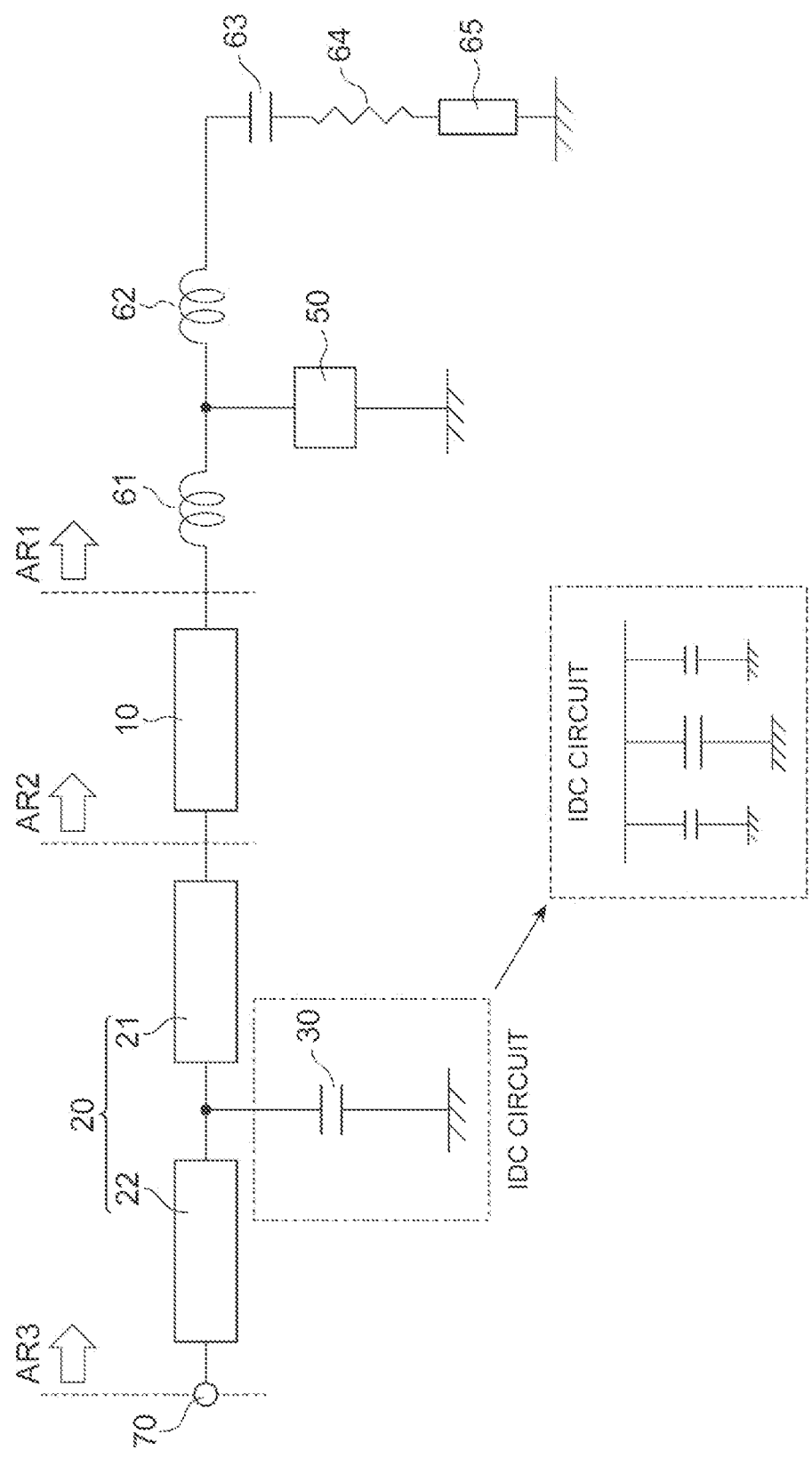
FIG. 2 is an equivalent circuit of the semiconductor device illustrated in FIG. 1.

FIG. 2 is an equivalent circuit of the semiconductor device 1. The configuration elements of the semiconductor device 1 having small influence on the impedance matching are omitted. In the equivalent circuit, the 2nd signal line 20, the capacitor 30, the 1st signal line 10, and the wire 61 are provided in this order on the path of the electric signal from the input terminal 70 to the semiconductor element 50. The wire 62, the capacitor 63, and the resistor 64 are provided in this order at a following stage of the semiconductor element 50. The wire 61 and the wire 62 are represented as inductors in the equivalent circuit. An enlarged view (detailed view) of the capacitor 30 is also illustrated in FIG. 2. This figure shows that the capacitance of IDC is added in a distributed manner.

Figure 3:
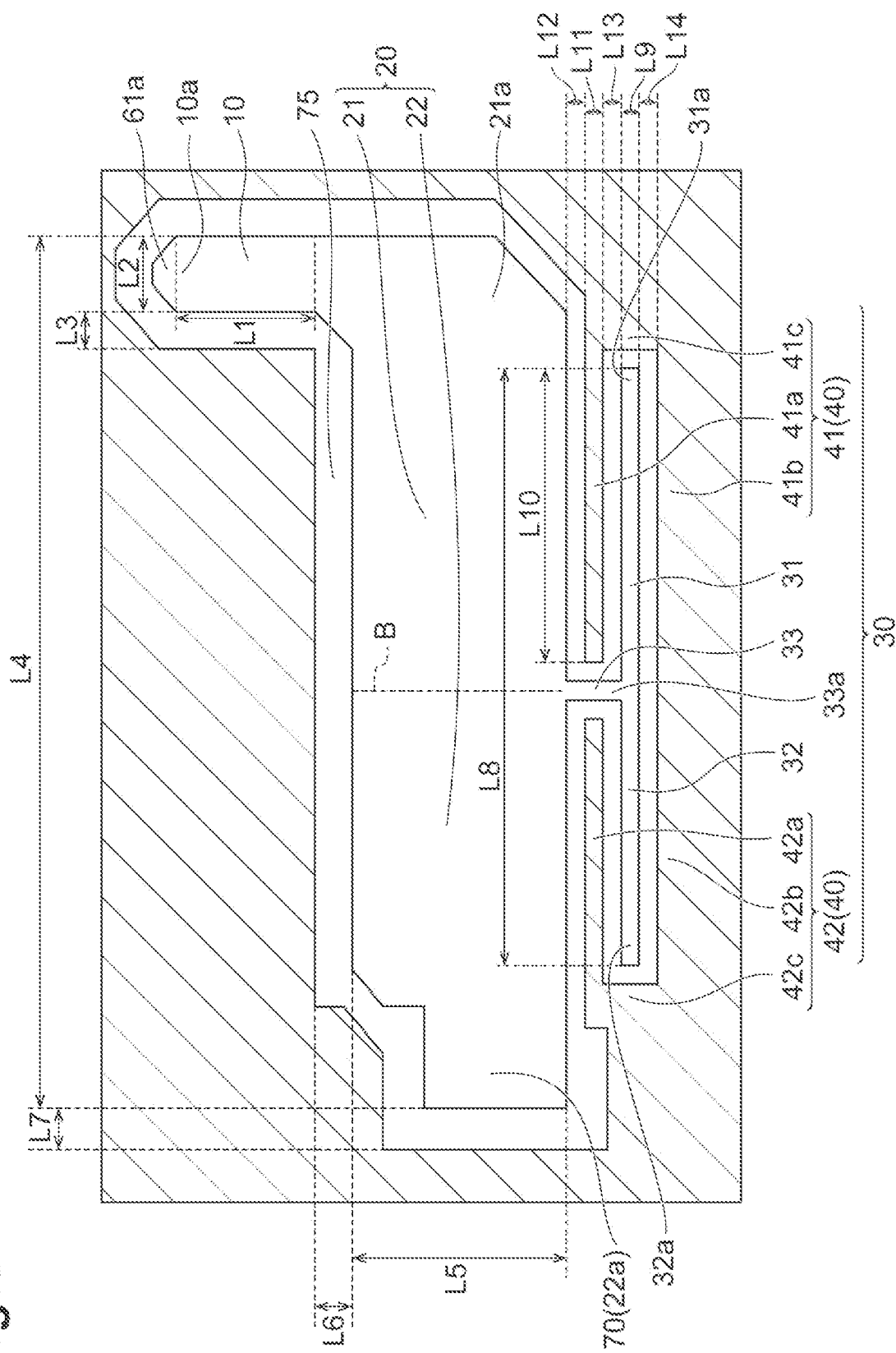
FIG. 3 is an enlarged view of signal lines and capacitors and surroundings thereof in FIG. 1.

Details of the 1st signal line 10, the 2nd signal line 20, and capacitor 30 will be described with reference to FIG. 3. FIG. 3 is an enlarged view of the 1st signal line 10, the 2nd signal line 20, and the capacitor 30 illustrated in FIG. 1.

In FIG. 3, a length of the 1st signal line 10 in the longitudinal direction (line length) is illustrated as a length L1. A length in the direction orthogonal to the longitudinal direction of the 1st signal line 10 (line width) is illustrated as a length L2. The 1st signal line 10 is a coplanar line (coplanar wave guide (CPW)) using the ground pattern 40. A distance from the metal pattern of the 1st signal line 10 to the ground pattern 40 (slot width) is illustrated as a length L3. The 1st signal line 10 has a constant width in the longitudinal direction (not have a tapered shape). That is, the width of the 1st signal line 10 is the constant length L2 through the length L1. The end part 10a on the side opposite to the 2nd signal line 20 in the 1st signal line 10 is connected to the semi-conductor element 50 (FIG. 1) via the bonding pattern 61a and the wire 61 (FIG. 1). The bonding pattern 61a may be provided separately from the 1st signal line 10. The 1st signal line 10 may be designed to have impedance (characteristic impedance) of 50 ohm. In this example of dimensions of the 1st signal line 10, the line length (the length L1) is 200 μm, the line width (the length L2) is 70 μm, and the slot width (the length L3) is 35 μm.

A line length of the 2nd signal line 20 is illustrated in FIG. 3 while being referred to as a length L4. A line width of the 2nd signal line 20 is illustrated as a length L5. Similarly to the 1st signal line 10, the 2nd signal line 20 may be a coplanar line, and the slot width of the 2nd signal line 20 is illustrated as a length L6. The 2nd signal line 20 may be designed to have impedance of, for example, 35 ohm. In this example of dimensions of the 2nd signal line 20, the line length (the length L4) is 1000 µm, the line width (the length L5) is 240 µm and the slot width (the length L6) is 35 µm. In this example, the line length of the 2nd signal line 20 is longer than the line length of the 1st signal line 10. Specifically, the line length of the 2nd signal line 20 is approximately 5 times the line length of the 1st signal line 10. The line width of the 2nd signal line 20 is wider than the line width of the 1st signal line 10 (equal to or more than twice, for example). Specifically, the line width of the 2nd signal line 20 is approximately 3.5 times the line width of the 1st signal line 10.

In the 2nd signal line 20, a boundary B between the 1st part 21 and the 2nd part 22 may be positioned in the vicinity of a center (including the center) of the 2nd signal line 20 in the longitudinal direction. However, depending on the designed frequency band, the position does not necessarily need to be in the vicinity of the center. If the boundary B is positioned in the vicinity of the center, the line length of each of the 1st part 21 and the 2nd part 22 is half the line length of 2nd signal line 20.

The 1st part 21 of the 2nd signal line 20 includes a connection part 21a. The connection part 21a is a connection part of the 1st signal line 10 and the 2nd signal line 20, and is bent. In the example illustrated in FIG. 3, the connection part 21a is bent with an angle of 90° such that a signal path becomes the shortest in the forwarding direction of the electric signal (the direction toward the semiconductor element 50). The 1st signal line 10 and the 2nd signal line 20 are connected in an L shape by the connection part 21a. That is, in a plan view, (when the main surface 2a is seen from the front), the 1st signal line 10 and the 2nd signal line 20 have an L shape as a whole. In this example, one end of the 1st signal line 10 is connected to the semiconductor element 50 (via the bonding pattern 61a and the wire 61). The other end of the 1st signal line 10 is connected to the 2nd signal line 20. The semiconductor element 50 (FIG. 1) is provided on one end side of the 1st signal line 10. The capacitor 30 is provided on the side opposite to the one end side of the 1st signal line 10 across the 2nd signal line 20. In the example illustrated in FIG. 3, the semiconductor element 50 is positioned on an extended line of the 1st signal line 10 in the longitudinal direction. However, the semiconductor element 50 may be positioned on the extended line of the 1st signal line 10 in the width direction. In that case, the semiconductor element 50 may be positioned on the side opposite to the capacitor 30 across the 2nd signal line 20.

The end part 22a on the side opposite to the boundary B in the 2nd part 22 of the 2nd signal line 20 may be the input terminal 70. In the example illustrated in FIG. 3, the line width of the input terminal 70 part in the 1st part 21 is narrower than the line width of the other part, but the line widths of both parts may be the same. The wire 71 (FIG. 1) is connected to the input terminal 70. A distance between the input terminal 70 and the ground pattern 40 in the longitudinal direction of the 2nd signal line 20 is illustrated as a length L7. The length L7 may be the same as the slot width (length L6) of the 1st signal line 10.

The capacitor 30 further includes a base part 33 in addition to the 1st extension part 31, the 2nd extension part 32, the 1st ground part 41 and the 2nd ground part 42 described above with reference to FIG. 1. The base part 33 is a part directly connected to the 2nd signal line 20 and extends in a direction crossing the 2nd signal line 20. In this example, the base part 33 extends toward the side opposite to the 1st signal line 10 and the semiconductor element 50, with a part where the boundary B in the 2nd signal line 20 is positioned as a base end. The 1st extension part 31 and the 2nd extension part 32 extend in the opposite directions to each other from the distal end part 33a of the base part 33. A length of a part configured with the 1st extension part 31, the 2nd extension part 32 and the base part 33 of the capacitor 30 in the longitudinal direction of the 2nd signal line 20 is illustrated as a length L8. A pattern width of the 1st extension part 31 is illustrated as a length L9. A pattern width of the 2nd extension part 32 may be the same as the pattern width (length L9) of the 1st extension part 31.

The 1st extension part 31 of the capacitor 30 is provided to face the 1st part 21 of the 2nd signal line 20. The 1st ground part 41 is provided on both sides of the 1st extension part 31. The 1st ground part 41 includes a ground part 41a, a ground part 41b and a ground part 41c.

The ground part 41a is a part positioned between the 1st part 21 and 1st extension part 31. The ground part 41a is provided to be electrically coupled with the 1st extension part 31 over the longitudinal direction of the 1st extension part 31. The ground part 41a is provided to be also electrically coupled with the 1st part 21 over the longitudinal direction of the 1st part 21. The length of a part of the ground part 41a facing the 1st extension part 31 is illustrated as length L10. A pattern width of the ground part 41a is illustrated as a length L11. A distance between the 1st part 21 and the ground part 41a is illustrated as a length L12. A distance between the ground part 41a and the 1st extension part 31 is illustrated as length L13.

The ground part 41b is a part positioned on the side opposite to the ground part 41a across the 1st part 21. The ground part 41b is provided to be electrically coupled with the 1st extension part 31 over the longitudinal direction of the 1st extension part 31. A distance between the ground part 41b and the 1st extension part 31 is illustrated as a length L14.

The ground part 41c is a part that connects the ground part 41a and the ground part 42b. The ground part 41a may be provided to be electrically coupled with the distal end part 31a of the 1st extension part 31. The ground part 41a, the ground part 41b, and the ground part 41c may have a U shape having the 1st extension part 31 in their inner side in a plan view.

The 2nd extension part 32 of the capacitor 30 is provided to face the 2nd part 22 of the 2nd signal line 20. The 2nd ground part 42 is provided on both sides of the 2nd extension part 32. The 2nd ground part 42 includes a ground part 42a, a ground part 42b and a ground part 42c.

The ground part 42a is a part positioned between the 2nd part 22 and the 2nd extension part 32. The ground part 42a is provided to be electrically coupled with the 2nd extension part 32 over the longitudinal direction of the 2nd extension part 32. The ground part 42a is provided to be also electrically coupled with the 2nd part 22 over the longitudinal direction of the 2nd part 22. A length of a part of the ground part 42a, which faces the 2nd extension part 32, may be the same as the length (length L10) of the part of the ground part 41a, which faces the 1st extension part 31. The pattern width of the ground part 42a may be the same as the pattern width (length L11) of the ground part 41a. A distance between the 2nd part 22 and the ground part 42a may be the same as the distance (length L12) between the 1st part 21 and the ground part 41a. A distance between the ground part 42a and the 2nd extension part 32 may be the same as the distance (length L13) between the ground part 41a and the 1st extension part 31.

The ground part 42b is a part positioned on the side opposite to the ground part 42a across the 2nd part 22. The ground part 42b is provided to be electrically coupled with the 2nd extension part 32 over the longitudinal direction of the 2nd extension part 32. The distance between the ground part 42b and the 2nd extension part 32 may be the same as the distance (length L14) between the ground part 41b and the 1st extension part 31.

The ground part 42c is a part that connects the ground part 42a and the ground part 42b. The ground part 42c may be provided to be electrically coupled with the distal end part 32a of the 2nd extension part 32. The ground part 42a, the ground part 42b, and the ground part 42c may have a U shape having the 2nd extension part 32 in their inner side in a plan view.

The capacitor 30 is designed to have a capacitance of 100 fF (approximately 50 fF to 200 fF), as a whole for example. This capacitance can be given to the 2nd signal line 20 in a distribution constant manner. As an example of the dimension of the capacitor 30, the entire length of the capacitor 30 (length L8) is 630 μm (620 μm to 640 μm). In the ground part 41a, the length (length L10) of a part facing the 1st extension part 31 is approximately 300 μm. In the ground part 41a, the length of a part facing the 2nd extension part 32 may also be approximately 300 μm. The other lengths L9 and L11 to L14 are all approximately 30 μm (20 μm to 50 μm).

A result of simulation of the semiconductor device 1 described above will be described. In the simulation, the impedance of the 1st signal line 10 was set to 50 ohm. The line length (length L1 in FIG. 3) of the 1st signal line 10 was set to 200 μm. The impedance of the 2nd signal line 20 was set to 35 ohm. The line length (length L4 in FIG. 3) of the 2nd signal line 20 was set to 1000 μm. The dimensions relating to the capacitor 30 (lengths L8 to L14 in FIG. 3) were set to be the values described above. That is, the length L8 was set to 630 μm. The length L10 was set to 295 μm (approximately 300 μm). Each of the lengths of L9 and L11 to L14 was set to 20 μm. A relative dielectric constant of the insulation substrate 2 was set to 8.8. A thickness of insulation substrate 2 was set to 750 μm. A thickness of the metal pattern was set to 3 μcm. An inductance of the wire 61 was set to 0.4 nH. An inductance of the wire 62 was set to 1.0 nH. The capacitance of the capacitor 63 was set to 10 nF to 100 nF. A resistance of the resistor 64 was set to 50 ohm. For the semiconductor element 50, an S parameter model was used in consideration of EML.

Figure 4:
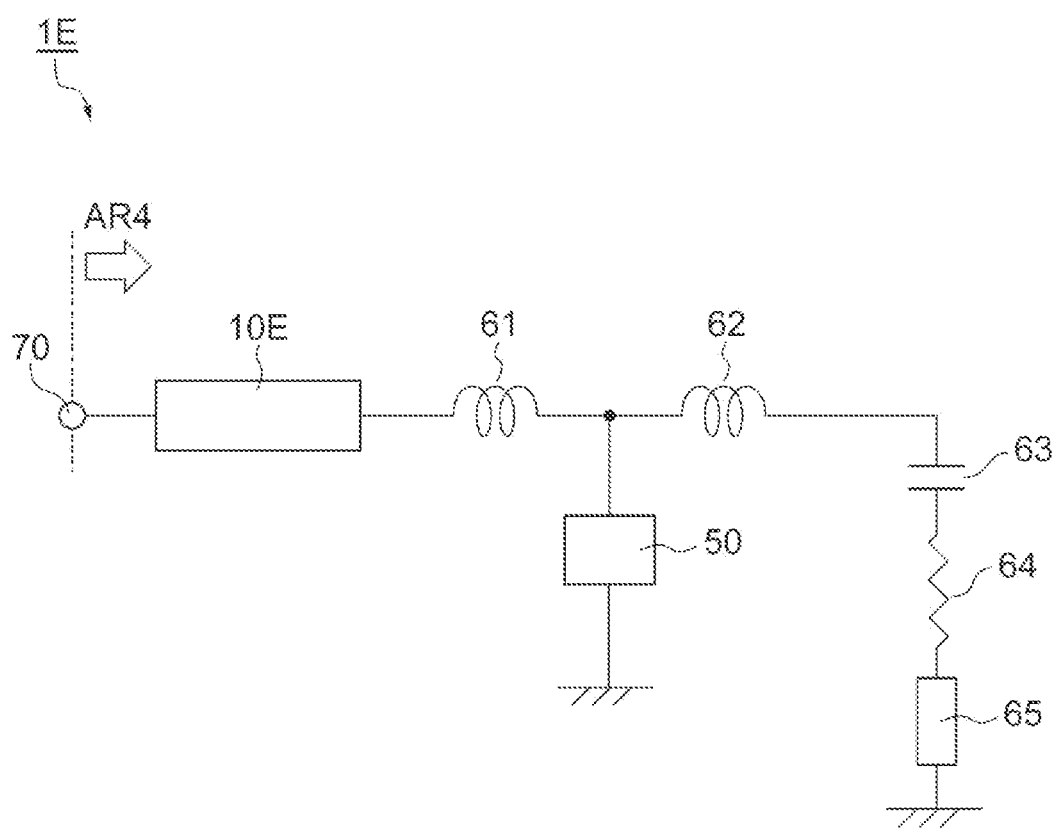
FIG. 4 is an equivalent circuit diagram of a semiconductor device according to a comparison example.

A simulation of the semiconductor device according to a comparison example illustrated in FIG. 4 was also performed together. The semiconductor device 1E illustrated in FIG. 4 is different from the semiconductor device 1 (FIG. 2) in a point that the semiconductor device 1E includes a signal line 10E while not including the 1st signal line 10, the 2nd signal line 20, and the capacitor 30. In the simulation, the impedance of the signal line 10E of the semiconductor device 1E according to the comparison example is set to 50 ohm, the line length of the signal line 10E is set to be the total length of the line length of the 1st signal line 10 and the 2nd signal line 20 (FIG. 2).

Figure 5:
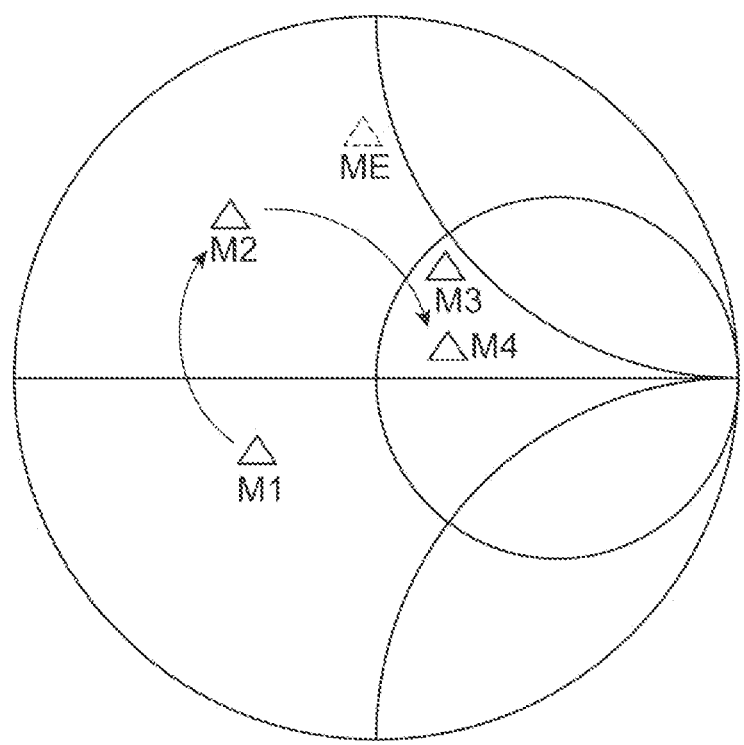
FIG. 5 is a diagram illustrating a result of simulation of S parameters.

The Smith chart illustrated in FIG. 5 indicates S11, that is, the impedance in each position of the semiconductor device 1. The center of the Smith chart indicates 50 ohm. In FIG. 5, S11 at the frequency=15 GHz is indicated by a triangular marker. The 15 GHz is the center frequency of the simulation frequency 0 to 30 GHz. Although not illustrated, S11 in this frequency range shows a clockwise trajectory passing through the marker.

The markers M1 to M4 indicate the impedances of the semiconductor device 1 (FIG. 2) according to the embodiment. A marker ME indicates the impedance of the semiconductor device 1E (FIG. 4) according to the comparison example.

The marker M1 indicates the S11 of the semiconductor element 50 seen from a position (an arrow AR1 in FIG. 2) between the 1st signal line 10 and the wire 61. The impedance indicated by the marker M1 indicates a capacitive and has a resistance value of lower than 50 ohm.

The marker M2 indicates the S11 of the 1st signal line 10 seen from the position (an arrow AR2 in FIG. 2) between the 2nd signal line 20 and the 1st signal line 10. This marker M2 indicates the impedance obtained by rotating the marker M1 on the Smith chart as much as the 1st signal line 10. The impedance indicated by the marker M2 is different from the marker M1, indicating the inductivity.

The marker M3 indicates the impedance of the 2nd signal line 20 seen from the input terminal 70 (an arrow AR3 in FIG. 2) when there is no capacitor 30 in the semiconductor device 1. The marker M3 indicates the impedance obtained by rotating the marker M2 on the Smith chart as much as the 2nd signal line 20. The marker M3 approaches closer to the center of the Smith chart than the marker M2 does. In this example, the impedance indicated by the marker M3 indicates the inductivity, and has a resistance value higher than 50 ohm.

The marker M4 indicates the impedance of the 2nd signal line 20 seen from the input terminal 70 (an arrow AR3 in FIG. 2) when there is a capacitor 30 in the semiconductor device 1. This marker M4 indicates the impedance obtained by rotating the marker M3 as much as the capacitor 30 on the Smith chart. The marker M4 approaches closer to the center of the Smith chart than the marker M3 does. In this example, the impedance indicated by the marker M4 indicates the inductivity, and has a resistance value higher than 50 ohm.

The marker ME indicates the impedance of the signal line 10E seen from the input terminal 70 (an arrow AR4 in FIG. 4) in the semiconductor device 1E (FIG. 4) according to the comparison example. The marker ME indicates the impedance obtained by rotating the marker M1 on the Smith chart as much as the signal line 10E. The marker ME leaves away from the center of the Smith chart than the marker M3 and the marker M4 do. In this example, the impedance indicated by the marker ME indicates the inductivity, and has a resistance value of lower than 50 ohm.

Figure 6:
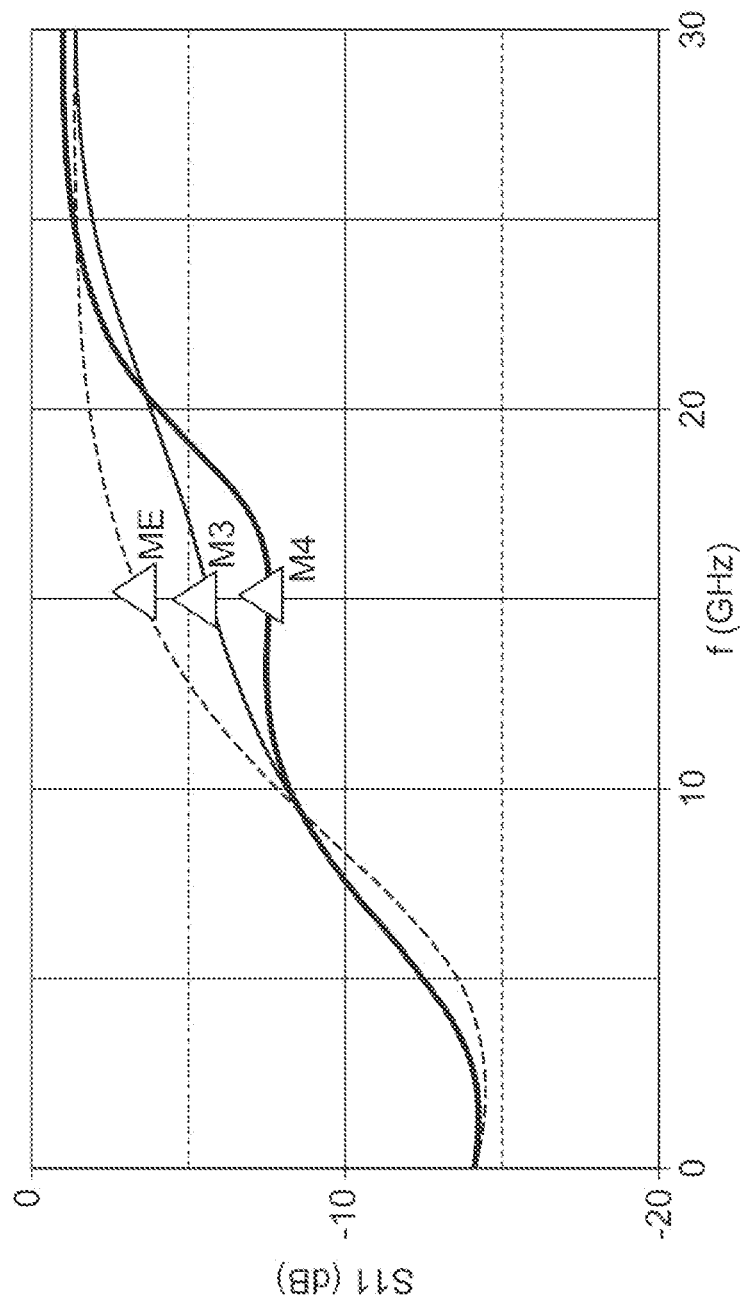
FIG. 6 is a diagram illustrating a result of simulation of S parameters.

FIG. 6 illustrates a graph of S11. The horizontal axis in the graph represents the frequency, and the vertical axis represents the magnitude (dB) of S11. The markers M3, M4 and ME illustrated in the graph respectively correspond to the markers M3, M4 and ME in FIG. 5 described above. In this example, in a wide band frequency range up to approximately 23 GHz, the magnitude of S11 indicated by the curve passing through the markers M3 and M4 is generally smaller than the magnitude of S11 indicated by the curve passing through the marker ME. Especially in the high frequency band where the frequency exceeds 10 GHz, although the curve passing through the marker ME tends to rise, the rise of the curve passing through the marker M3 and the marker M4 is suppressed. Therefore, the wider band impedance matching is realized in the semiconductor device 1 than that in the semiconductor device 1E.

Figure 7:
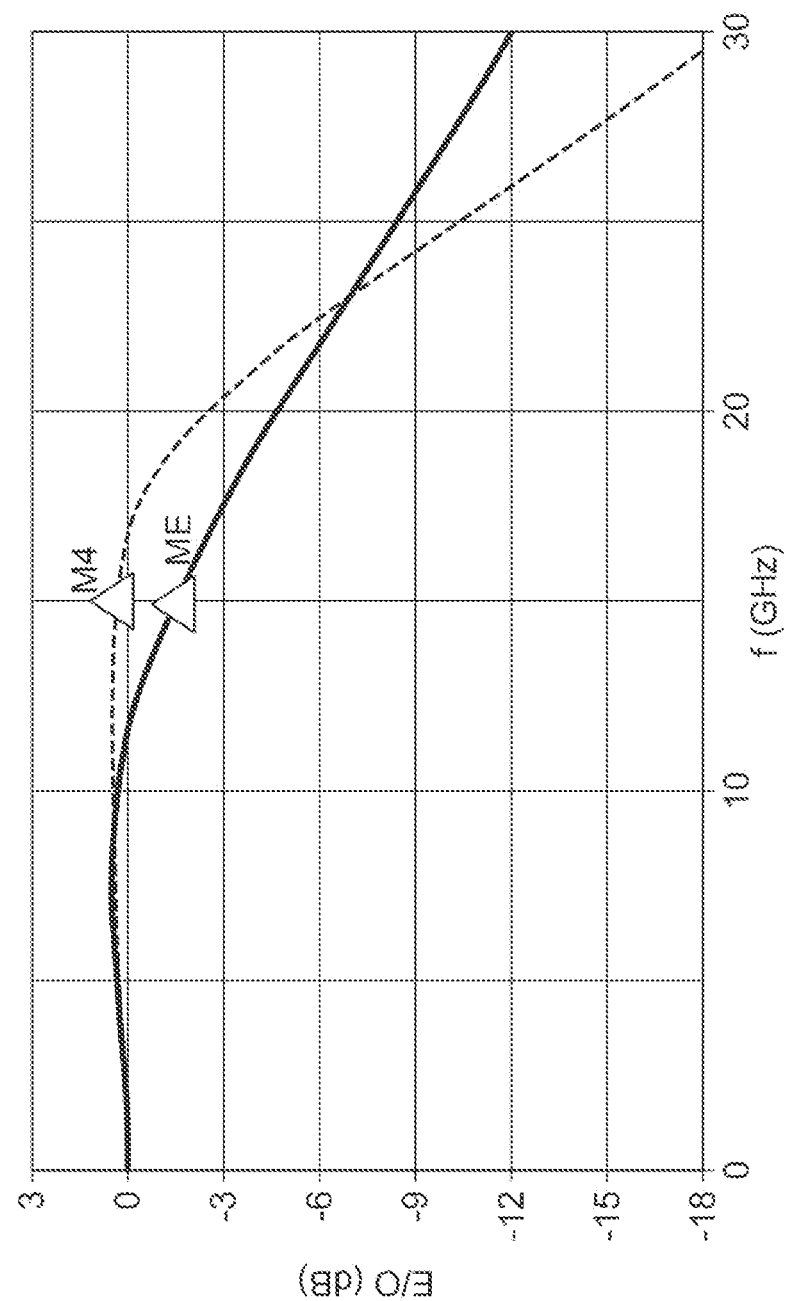
FIG. 7 is a diagram illustrating a result of simulation of S parameters.

Conversion characteristics (E/O) of the marker M4 and the marker ME will be compared as illustrated in FIG. 7. FIG. 7 illustrates the conversion characteristics (E/O characteristics) of electricity (E) to light (O) in the semiconductor element 50 (EML in this example) in FIG. 2. The horizontal axis in the graph represents the frequency and the vertical axis represents the magnitude (dB) of the conversion characteristics. In the wide band frequency range up to approximately 23 GHz, the magnitude of the conversion characteristics indicated by the curve through the marker M4 is generally larger than the magnitude of the conversion characteristics indicated by the curve through the marker ME. Especially in the high frequency band where the frequency exceeds 10 GHz, the curve passing through the marker M4 extends to a higher frequency than the curve passing through the marker ME in the region where the conversion characteristic is close to 0 dB. From this point also, it is understood that the wider band impedance matching can be realized in the semiconductor device 1 than that in the semiconductor device 1E.

Figure 8A:
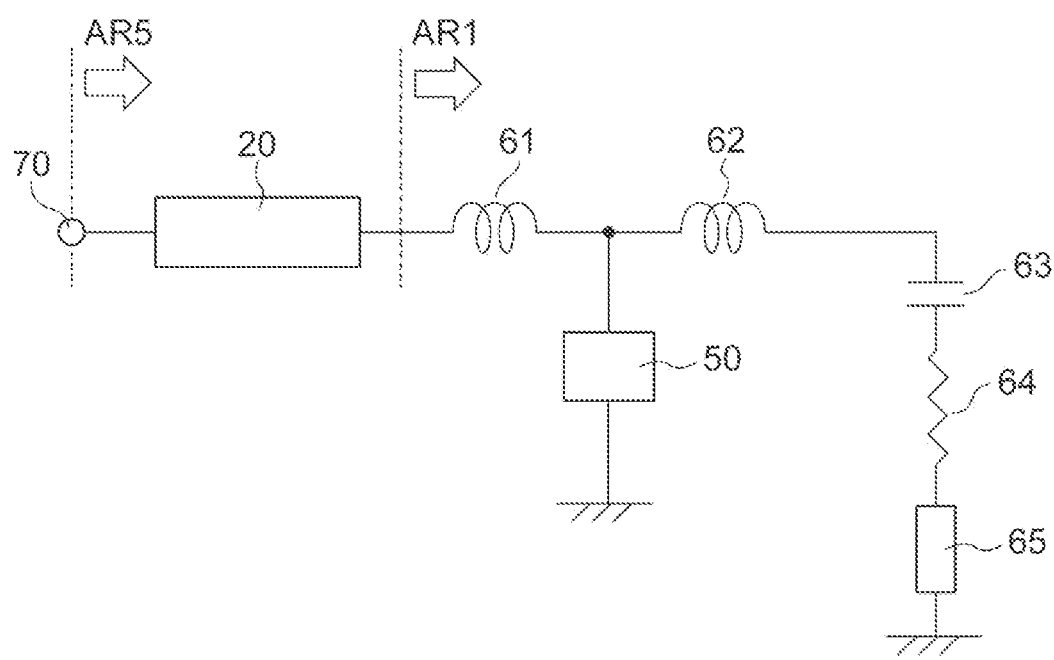
FIG. 8A is a diagram illustrating an equivalent circuit of a semiconductor device according to the comparison example.
Figure 8B:
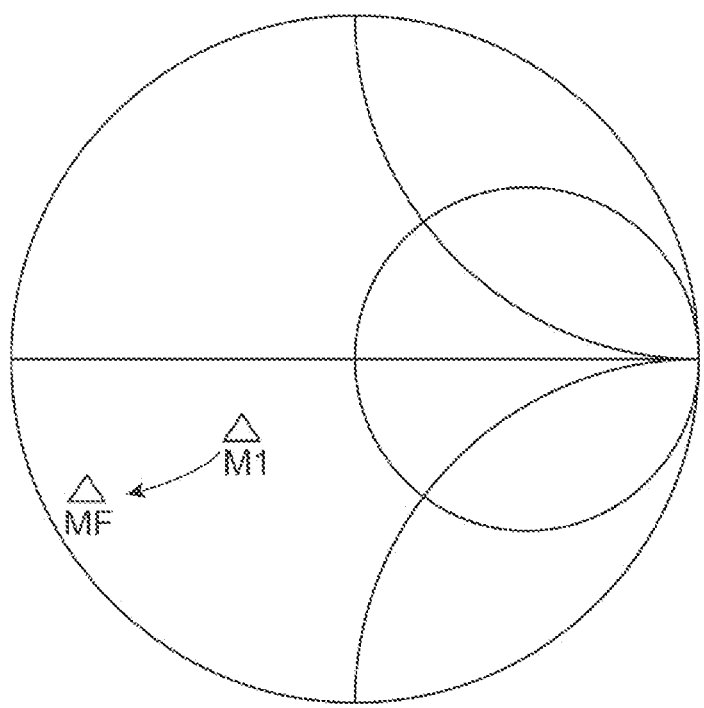
FIG. 8B is a diagram illustrating a result of simulation according to the comparison example.

In the semiconductor device 1 according to the embodiment, the 1st signal line 10 having a relatively high impedance and the 2nd signal line 20 having a relatively low impedance are provided in this order from the semiconductor element 50 toward the input terminal 70. If the semiconductor device 1 includes the 2nd signal line 20 without having the 1st signal line 10, the effects described with reference to FIG. 4 to FIG. 7 cannot be obtained. For example, as illustrated in FIG. 8A, if only the 2nd signal line 20 is connected between the wire 61 and the input terminal 70, the impedance of the 2nd signal line 20 seen from the input terminal 70 (the arrow AR5) is the impedance indicated by the marker MF in FIG. 8B. The marker MF leaves away from the center of the Smith chart than the marker M1 does. Like the semiconductor device 1 according to the embodiment, by rotating the impedance on the Smith chart using the impedance of the 1st signal line 10 that is relatively high, and then, by rotating the impedance on the Smith chart using the impedance of the 2nd signal line 20 that is relatively low, it is possible to bring the impedance closer to the center of the Smith chart.

The semiconductor device 1 described above includes the insulation substrate 2, the semiconductor element 50, the input terminal 70, the 1st signal line 10, the 2nd signal line 20, and the capacitor 30. The ground pattern 40 having a reference potential (for example 0 V) is provided on the insulation substrate 2. The electric signal supplied to the semiconductor element 50 is input to the input terminal 70. The 1st signal line 10 is electrically connected between the semiconductor element 50 and the input terminal 70, and is provided on the insulation substrate 2. The 2nd signal line 20 is electrically connected between the 1st signal line 10 and the input terminal 70, and is provided on the insulation substrate 2. The capacitor 30 is connected to the 2nd signal line 20. The 2nd signal line 20 has impedance lower than the impedance of the 1st signal line 10. The capacitor 30 includes the 1st extension part 31 and the 2nd extension part 32, and the 1st ground part 41 and the 2nd ground part 42. The 1st extension part 31 and the 2nd extension part 32 are connected to the 2nd signal line 20, and are provided on the insulation substrate 2 to extend along the longitudinal direction of the 2nd signal line 20. The 1st ground part 41 and the 2nd ground part 42 are at least a part of the ground pattern 40, and are provided between the 1st extension part 31 and the 2nd extension part 32 and 2nd signal line 20, and between the 1st extension part 31 and the 2nd extension part 32 and the end part of the insulation substrate 2 to be electrically coupled with the 1st extension part 31 and the 2nd extension part 32.

In the semiconductor device in the related art, for example, in the semiconductor device 1E of FIG. 4, the signal line 10E having a constant impedance (for example, 50 ohm) is provided between the semiconductor element 50 and the input terminal 70. In contrast, in the semiconductor device 1 according to the embodiment, the 1st signal line 10, the 2nd signal line 20, and the capacitor 30 are provided between the semiconductor element 50 and the input terminal 70. The 2nd signal line 20 has impedance lower than the impedance of the 1st signal line 10. As described above, by providing two signal lines of the 1st signal line 10 and the 2nd signal line 20 having different impedances, the impedance matching can be obtained up to a higher frequency band compared to a case of the semiconductor device 1E in the related art (the marker M3 and marker ME in FIG. 5). In addition, since the capacitor 30 is connected to the 2nd signal line 20, it is possible to perform the optimum impedance matching up to a higher frequency band (the marker M4 and the marker ME in FIG. 5 to FIG. 7).

Among the 1st ground part 41 and the 2nd ground part 42 (the 2nd metal pattern), the ground part 41a and the ground part 42a positioned between the 2nd signal line 20 and the 1st extension part 31 and the 2nd extension part 32 (the 1st metal pattern) may be provided to be electrically coupled with the 2nd signal line 20. In this way, it is possible to give the capacitance to the 2nd signal line 20 in distributed manner using the electrical coupling between the ground part 41a and the ground part 42a (the 2nd metal pattern) and the 2nd signal line 20.

The impedance of the 2nd signal line 20 may be lower than 50 ohm. In this way, when the 1st signal line has impedance equal to or higher than 50 ohm, the 2nd signal line 20 having a lower impedance can be obtained.

The 1st signal line 10 may have a constant width (length L2 in FIG. 3) in the longitudinal direction. This facilitates a desired impedance design because the 1st signal line 10 can have a constant impedance in the longitudinal direction.

The connection part (connection part 21a) of the 1st signal line 10 and the 2nd signal line 20 may be bent. In this way, the overall length of the signal lines (the 1st signal line 10 and the 2nd signal line 20) in one direction can be suppressed, and thus, it is possible to minimize the size of the semiconductor device 1.

The 1st signal line 10 and the 2nd signal line 20 may be connected in an L shape, one end of the signal line of the 1st signal line 10 may be connected to the semiconductor element 50, and an other end of the 1st signal line 10 may be connected to the 2nd signal line 20, and the semiconductor element 50 may be provided on one end side of the 1st signal line 10, and the capacitor 30 may be provided on the side opposite to one end side of the 1st signal line 10 crossing the 2nd signal line 20. In this way, since the capacitor 30 is provided at a position relatively far from (not too close to) the semiconductor element 50 and the 1st signal line 10, it is possible to suppress the influence on the electrical characteristics due to the interference between the capacitor 30 and the semiconductor element 50 and the 1st signal line 10. If the 1st signal line 10 and the 2nd signal line 20 are connected in a straight line to be in the same direction as the optical signal (output) instead of the L shape while the semiconductor element 50 is provided at the same position, the length of the wire 61 connecting the 1st signal line 10 and the semiconductor element 50 becomes long. When the length of the wire 61 becomes long, since the inductance of the wire 61 is correspondingly increased, it becomes difficult to obtain the impedance matching described above with reference to FIG. 5 and the like. By connecting the 1st signal line 10 and the 2nd signal line 20 in an L shape, the end part 10a of the 1st signal line 10 can be brought close to the semi-conductor element 50. Because the length of wire 61 becomes short as much as that amount, the impedance matching can easily be obtained. Furthermore, it is possible to reduce the influence of the semiconductor element 50 and the capacitor 30 on the 1st signal line 10 in the high frequency characteristic compared to a case where both the semiconductor element 50 and the capacitor 30 are provided on the same side with respect to the 2nd signal line 20.

The 1st signal line 10 and the 2nd signal line 20 may be coplanar lines using the ground pattern 40. In this way, for example, it is possible to easily create the 1st signal line 10 and the 2nd signal line 20 compared to a case where the 1st signal line 10 and the 2nd signal line 20 are microstrip lines.

The capacitor 30 may be connected to the boundary part between the 1st part 21 and the 2nd part 22 of the 2nd signal line 20. In this way, since the capacitor 30 is provided separated from the 1st signal line 10 as much as the length of the 1st part 21, it is possible to reliably apply the capacitor 30 to the 2nd signal line 20, not to the 1st signal line 10.

The capacitor 30 may be an IDC. In this way, the capacitor can be arranged in a distribution constant manner along the 2nd signal line 20, and a desired capacitance can also be secured. The capacitor can also be installed in the existing package of the semiconductor device. Since the IDC can be formed by the mask pattern same as that of the signal lines of 1st signal line 10 and 2nd signal line 20, there is also an advantage that a number of process can be reduced. As the capacitor 30, it is conceivable to use a stub line or chip capacitor (lumped element) instead of the IDC. However, when the stub line is used, since a reactance component is locally inserted, the distribution constant effect cannot be obtained. In a single stub, it is conceivable that a layout in the package may be constrained. If a plurality of stub lines are provided in order to obtain the desired capacitance and the distribution constant effect, since a region occupied by the stub line becomes large, it becomes difficult to provide the stub lines in the existing package. This problem becomes obvious because it is necessary to provide the stub line to overhang the outside of the 2nd signal line 20 especially when the stub line is a low impedance line. When the chip capacitors are used, the chip capacitors having a large area is required and it is difficult to design a desired capacitance, and thus, a space for mounting the chip capacitors (a space considering spreading of brazing materials) is also required. Therefore, it becomes difficult to provide the chip capacitors in the existing package.

As described above, an embodiment of the present disclosure has been described, the present disclosure is not limited to the above embodiment.

The 1st signal line 10 and the 2nd signal line 20 may be lines other than coplanar lines. For example, the 1st signal line 10 and the 2nd signal line 20 may be a microstrip line using a ground pattern provided on the back surface (the surface opposite to the main surface 2a) of the insulation substrate 2.

In the example in the embodiment described above, the capacitor is provided on one side of the 2nd signal line 20. However, the capacitor may be provided on both sides of the 2nd signal line 20. FIG. 9 is an enlarged view of a signal line provided with such a capacitor and the surroundings thereof. In the example illustrated in FIG. 9, the capacitor 30-2 is connected to both sides of the 2nd signal line 20. The capacitor 30-2 includes a 1st extension part 31-2, a 2nd extension part 32-2, a base part 33-2, a 1st ground part 41-2, and a 2nd ground part 42-2. The details of these parts are the same as those of the 1st extension part 31, the 2nd extension part 32, the base part 33, the 1st ground part 41 and the 2nd ground part 42 of the capacitor 30 (FIG. 3) described above, and the descriptions thereof will not be repeated. An overall length (a length L8-2) of the capacitor 30-2 is approximately half the overall length of the capacitor 30 (the length L8 in FIG. 3), and for example, the length is 310 μm (310 μm to 320 μm). In the 1st ground part 41-2, the length L10-2 of the part facing the 1st extension part 31-2 (the part corresponding to the ground part 41a in FIG. 3) is, for example, approximately 130 μm. In the 2nd ground part 42-2, the length of the part facing the 2nd extension part 32-2 (the part corresponding to the ground part 42a in FIG. 3) is, for example, the same as above. The length of the other part of the capacitor 30-2 (the length corresponding to the length L9 and L11 to L14 relating to the capacitor 30 in FIG. 3) may be the same as the length of the corresponding part of the capacitor 30. The capacitance of the capacitor 30-2 is, for example, 50 fF (approximately 25 fF to 100 fF). Also in this example, the boundary B is positioned in the vicinity of the center of the 2nd signal line 20, but depending on the designed frequency band, the boundary B is not limited to be positioned in the vicinity of the center of the 2nd signal line 20.

In the example described with reference to FIG. 9, the capacitor 30-2 is provided on both sides of the 2nd signal line 20 along the longitudinal direction of the 2nd signal line 20. Even when such a capacitor 30-2 is used, it is possible to perform the optimum impedance matching up to a higher frequency band. It is possible to improve a degree of freedom of the space for providing the capacitor compared to a case where, for example, the capacitor is provided only on one side of the 2nd signal line 20.

Even if the semiconductor element 50 is not an optical semiconductor element such as EML but a high frequency device such as an FET, for example, by using the 1st signal line, the 2nd signal line and the capacitor in the transmission path of electric signal input to the gate of FET, it is possible to realize the wide band impedance matching. Hereinafter, such other embodiments will be described. The technical functions of each element using the terminology same as that in the above embodiment are the same before, and the descriptions thereof will not be repeated.

FIG. 10 is a plan view (layout) illustrating a schematic configuration of a semiconductor device 101 according to another embodiment. The semiconductor device 101 includes an input lead 151, an input side signal line 152, a transistor chip 153, an output side signal line 154, and an output lead 155 in such a manner that those are electrically connected in order. Each element is electrically connected to each other via the wire. In the example illustrated in FIG. 9, the input lead 151 and the input side signal line 152 are electrically connected to each other via the wire 171. The input side signal line 152 and the transistor chip 153 are electrically connected to each other via the wire 161. The transistor chip 153 and the output side signal line 154 are electrically connected to each other via the wire 162. The output side signal line 154 and the output lead 155 are electrically connected to each other via the wire 163. Each of the wires 161, 162, 163 and 171 may be configured with a plurality of wires.

In the example illustrated in FIG. 10, each element of the semiconductor device 101 is provided on a heatsink 156. A frame body 158 is also provided on the heatsink 156. The frame body 158 is a frame body for hermetic seals (hermetically sealing) provided for corrosion resistance and moisture resistance of the internal semiconductor element. As a material for the frame body 158, for example, Kovar is used. In this example, among the each element of the semiconductor device 101, the input lead 151 and the output lead 155 are positioned outside the frame body 158, and are electrically accessible to the outside of the semiconductor device 101. Other elements of the semiconductor device 101 are provided inside the frame body 158. In both end parts of heatsink 156, feedthroughs 157 are respectively provided for accepting the input lead 151 and the output lead 155 (i.e., for heatsink 156 to have the input lead 151 and output lead 155). The input lead 151 is electrically connected to the element inside the frame body 158 (the input side signal line 152 in this example) via a metalized part 151a and the wire 171. The output lead 155 is electrically connected to the element inside the frame body 158 (the output side signal line 154 in this example) via the metalized part 155a and the wire 163.

The input lead 151 supplies a bias voltage to the transistor chip 153. When the transistor chip 153 is an FET chip, the bias voltage is the gate bias voltage supplied to a gate pad. The output lead 155 supplies a power supply voltage to the transistor chip 153. When the transistor chip 153 is an FET chip, the power supply voltage is a drain voltage supplied to a drain pad. A source pad may be connected to the ground via a via hole (not illustrated) to have a reference potential, and in this case, the FET chip functions as an amplifier. The input lead 151 supplies an electric signal to the transistor chip 153. The electric signal is, for example, a wide band signal which may include a frequency components up to frequencies of 10 GHz, 20 GHz or higher as described above. The electric signal is amplified by the transistor chip 153, for example, and is output from the output lead 155.

Figure 11:
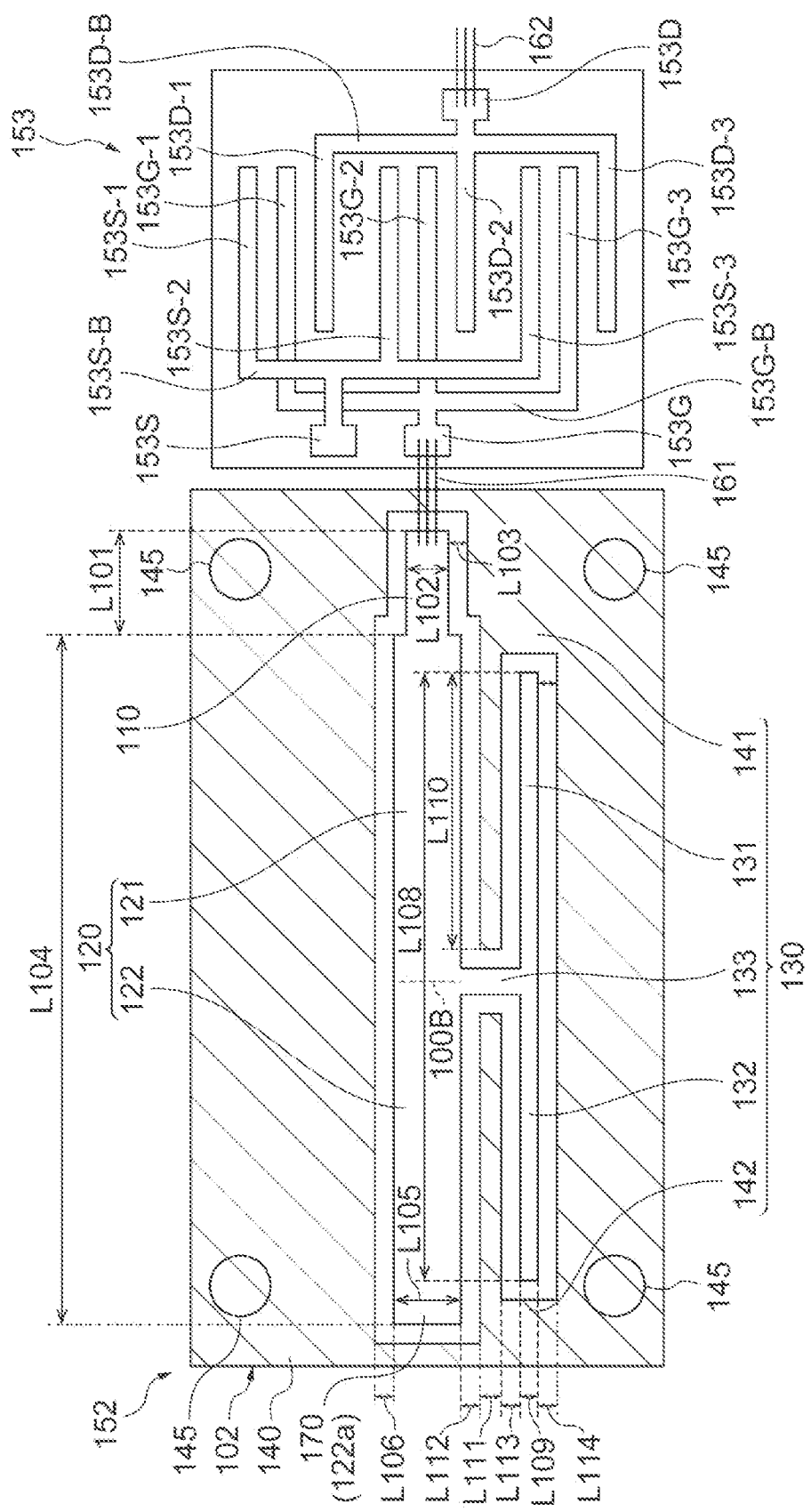
FIG. 11 is an enlarged view of input side signal lines and transistor chips illustrated in FIG. 10.

FIG. 11 is an enlarged view of the input side signal line 152 and the transistor chip 153. First, the transistor chip 153 will be described. The chip size of the transistor chip 153 is, for example, 1.5 mm in the longitudinal direction and 0.8 mm in the lateral direction. However, the chip size may be different depending on the magnitude (W) of the output.

The transistor chip 153 may include a plurality of FETs. In FIG. 11, a finger type FET in which a plurality of FETs are connected in parallel is illustrated. In this example, gate fingers 153G-1, 153G-2 and 153G-3 are connected to a gate pad 153G via a gate bus bar 153G-B. Drain fingers 153D-1, 153D-2 and 153D-3 are connected to a drain pad 153D via a drain bus bar 153D-B. Source fingers 153S-1, 153S-2 and 153S-3 are connected to a source pad 153S via a source bus bar 153S-B. The wire 161 is bonded to the gate pad 153G. The wire 162 is bonded to the drain pad 153D. The source pad 153S is connected to the ground by the via hole.

Next, the input side signal line 152 will be described. The input side signal line 152 is provided on (the main surface of) the insulation substrate 102. The insulation substrate 102 is, for example, an aluminum substrate (relative dielectric constant of approximately 9.5). The thickness of the insulation substrate 102 is, for example, 100 μm. The 1st signal line 110, the 2nd signal line 120, and the pattern of the capacitor 130, and the ground pattern 140 which are configuration elements of the input side signal line 152 are configured by sequentially providing titanium (Ti) and gold (Au) on the aluminum substrate (by forming a pattern). For example, the thickness of the titanium is approximately 200 nm and the thickness of the gold is approximately 300 nm.

The 1st signal line 110 is a coplanar line using the ground pattern 140. The ground pattern 140 is connected to the ground (for example, a back side pattern of the insulation substrate 102) via the via hole 145 to have a reference potential. The via hole 145 has, for example, a hole-like having an approximate inner diameter 80 μm. The 1st signal line 110 is connected (in a straight line) along the longitudinal direction of the 2nd signal line 120. The 2nd signal line 120 includes a 1st part 121 and a 2nd part 122. The 1st part 121 is a part connected to the 1st signal line 110. The end part 122a on the side opposite to the boundary 100B of the 1st part 121 and the 2nd part 122 in the 2nd part 122 may be an input terminal 170. The input terminal 170 is electrically connected to the input lead 151 via the wire 171 (FIG. 10).

A line length (a length L101) of the 1st signal line 110 is, for example, approximately 250 μm. A line width (a length L102) of the 1st signal line 110 is, for example, approximately 60 μm. A slot width (a length L103) of the 2nd signal line 120 is, for example, 30 μm. A line length (a length L104) of the 2nd signal line 120 is, for example, approximately 800 μm. A line width (a length L105) of the 2nd signal line 120 is, for example, approximately 240 μm. A slot width (a length L106) of the 2nd signal line 120 is, for example, approximately 30 μm. The line width of 1st signal line 110 is smaller (narrower) than the line width of the 2nd signal line. The 2nd signal line 120 has a lower impedance than the impedance of the 1st signal line 110. In this example, the boundary 100B between the 1st part 121 and the 2nd part 122 in the 2nd signal line is positioned in the vicinity of the center (including the center) of the 2nd signal line 120 in the longitudinal direction.

The capacitor 130 is provided on one side of the 2nd signal line 120. The capacitor 130 includes a 1st extension part 131, a 2nd extension part 132, a base part 133, a 1st ground part 141, and a 2nd ground part 142. The technical function of each element is the same as that of the 1st extension part 31, the 2nd extension part 32, the base part 33, the 1st ground part 41, and the 2nd ground part 42 described above with reference to FIG. 3, and the description thereof will not be repeated here. An overall length of the capacitor 130 (a length L108) is, for example, approximately 630 μm. In the 1st ground part 141, the length L110 of a part facing the 1st extension part 131 is, for example, approximately 300 μm. In the 2nd ground part 142, the length of a part facing the 2nd extension part 132-2 is the same. The lengths of other parts (the lengths L109 and L111 to L114) are all approximately 30 μm (20 μm to 50 μm).

As described above, since the input side signal line 152 is provided on the input side of the transistor chip 153, it is possible to perform the optimum impedance matching up to the high frequency band. This will be described using the result of simulation of the equivalent circuit next.

Figure 12A:
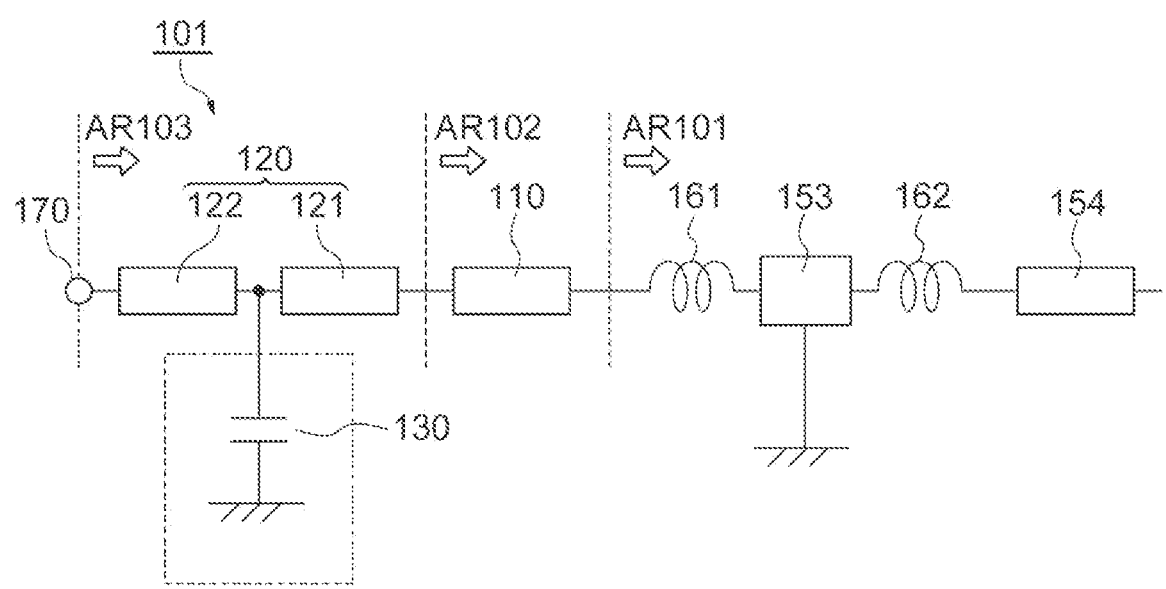
FIG. 12A is an equivalent circuit diagram of the semiconductor device illustrated in FIG. 10.

FIG. 12A is an equivalent circuit diagram of the semiconductor device 101 illustrated in FIG. 10. In the equivalent circuit, on the path of the electric signal from the input terminal 170 to the transistor chip 153, the 2nd signal line 120, the capacitor 130, the 1st signal line 110, and the wire 161 are provided in this order. Furthermore, the wire 162 and the output side signal line 154 are provided on the following stage of the transistor chip 153.

Figure 12B:
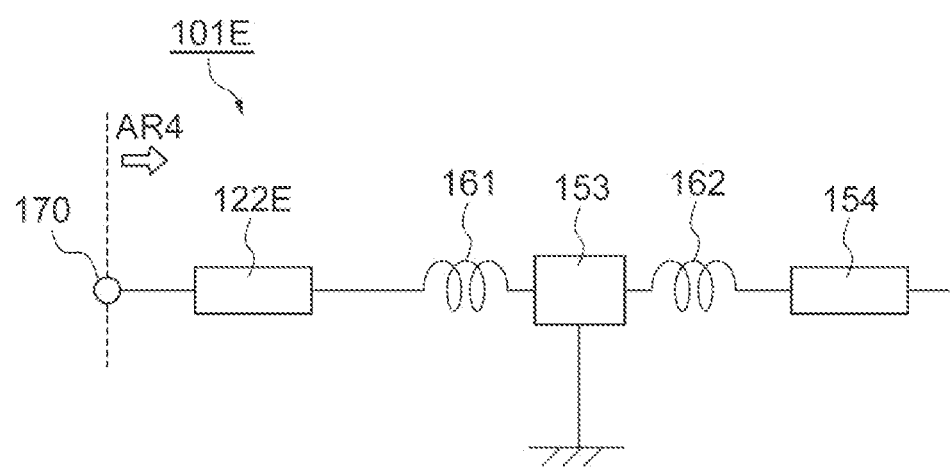
FIG. 12B is an equivalent circuit diagram of the semiconductor device according to the comparison example.

FIG. 12B is an equivalent circuit of the semiconductor device according to the comparison example. The semiconductor device 101E according to the comparison example differs from the semiconductor device 101 in a point that the semiconductor device 101E does not include the 1st signal line 110, the 2nd signal line 120 and the capacitor 130, but includes a signal line 122E.

The result of simulation will be described with reference to FIG. 13A and FIG. 13B. In the simulation, the impedance of the 1st signal line 110 was set to 50 ohm. The line length (the length L101 in FIG. 11) of the 1st signal line 110 was set to 250 µm. The impedance of 2nd signal line 120 was set to 35 ohm. The line length (the length L104 in FIG. 11) of the 2nd signal line 120 was set to 800 µm. The dimensions for the capacitor 130 (the lengths L108 to L114 in FIG. 11) were set to the values described above. That is, the length L108 was set to 630 µm. The length L110 was set to 295 µm (approximately 300 µm). All the lengths L109 and L111 to L114 were set to 20 µm. The relative dielectric constant of the insulation substrate 102 was set to approximately 9.5. The thickness of the insulation substrate 102 was set to 100 µm. The thickness of the metal pattern was set to 500 nm. The inductance of the wire 161 was set to 0.4 nH. The inductance of the wire 162 was set to 0.4 nH. The output impedance matching was performed including the output side signal line 154. For the transistor chip 153, an S parameter model assuming an FET chip was used. On the other hand, the impedance of the signal line 122E of the semiconductor device 101E (FIG. 12B) according to the comparison example is set to 50 ohm and the line length of the signal line 122E is set to be the total length of the line lengths of the 1st signal line 110 and the 2nd signal line 120.

Figure 13A:
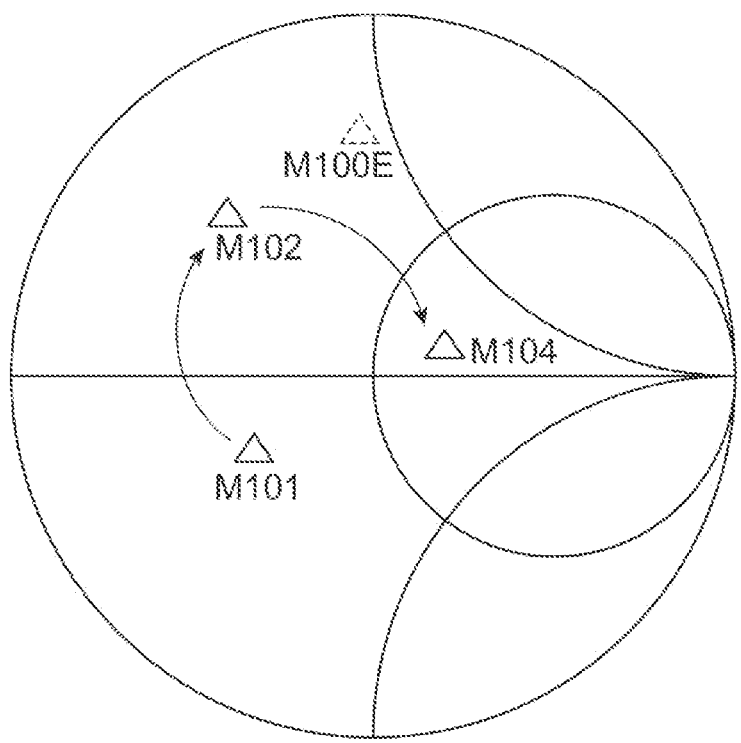
FIG. 13A is a diagram illustrating a result of simulation of the S parameters.

FIG. 13A illustrates S11 (impedance) in each position of the semiconductor device 101. A marker M101 indicates the impedance of the transistor chip 153 seen from the position between the 1st signal line 110 and the wire 161 (an arrow AR101 in FIG. 12A). A marker M102 indicates the impedance S11 of the 1st signal line 110 seen from the position between the 2nd signal line 120 and the 1st signal line 110 (an arrow AR102 in FIG. 12A). A marker M104 indicates the impedance of the 2nd signal line 120 seen from the input terminal 170 (an arrow AR103 in FIG. 12A). A marker M 100E indicates the impedance of the signal line 122E seen from the input terminal 170 (an arrow AR104 in FIG. 12B) in the semiconductor device 101E. A marker M104 is located closer to the center of the Smith chart than the marker M100E.

Figure 13B:
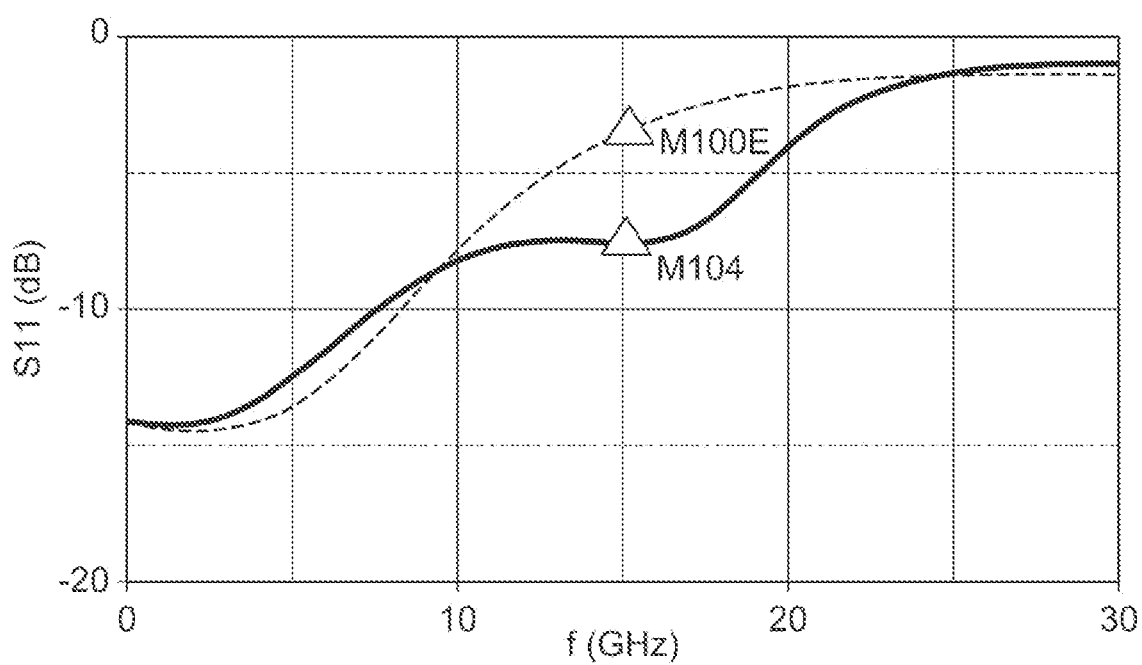
FIG. 13B is a diagram illustrating a result of simulation of the S parameters.

FIG. 13B illustrates a graph of S11. Similarly to FIG. 6 described above, in the wide band frequency range up to approximately 23 GHz, the magnitude of the S11 indicated by the curve through the marker M104 is generally smaller than the magnitude of the S11 indicated by the curve through marker M100 E. Especially in the high frequency band where the frequency exceeds 10 GHz, although the curve passing through marker M100E tends to rise, the rising of the curve passing through marker M104 is suppressed. Therefore, in the semiconductor device 101, a wider band impedance matching is realized than that in the semiconductor device 101E.

Several variations of the input side signal line 152 (FIG. 11) will be described with reference to FIGS. 14A, 14B and 15A. The dimensions of each part of the input side signal line in the variations may be the same as the dimensions of the corresponding part of the input side signal line 152 (FIG. 11) unless otherwise described.

Figure 14A:
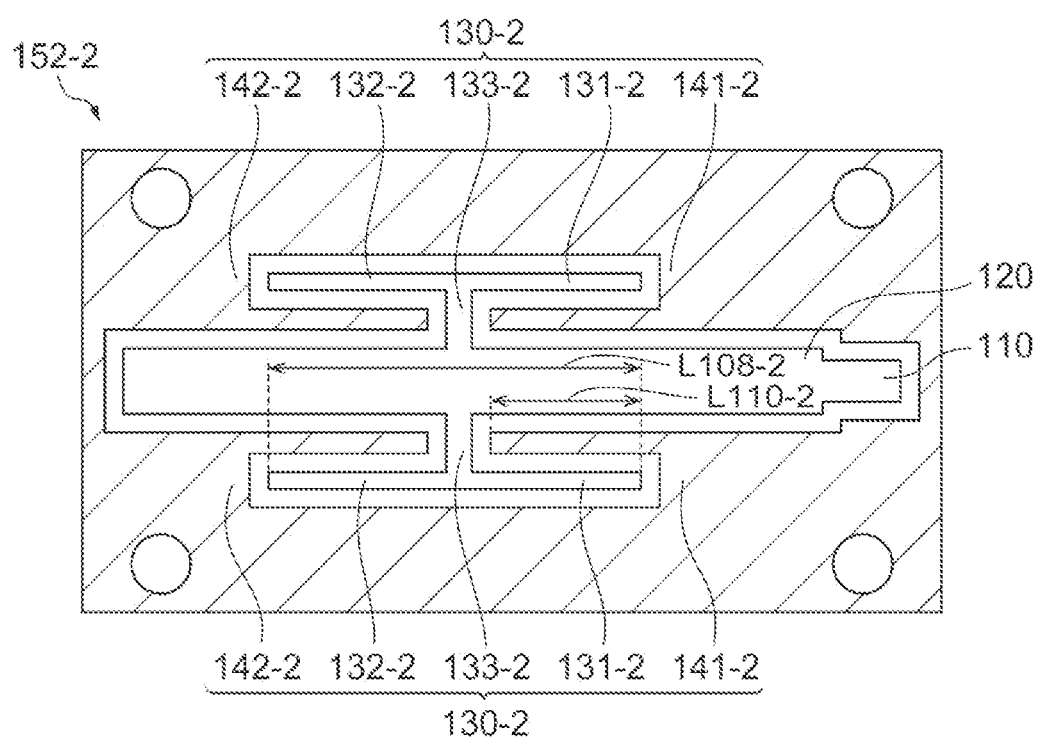
FIG. 14A is a diagram illustrating a variation of the input side signal lines.

In an input side signal line 152-2 illustrated in FIG. 14A, a capacitor 130-2 is connected to both sides of the 2nd signal line 120. The capacitance of the capacitor 130-2 is, for example, 50 fF (approximately 25 fF to 100 fF). In the capacitor 130-2, a length L108-2 of a part formed by the 1st extension part 131-2, the 2nd extension part 132-2 and the base part 133-2 in the longitudinal direction of the 2nd signal line 120 is for example, approximately 310 µm (295 µm to 320 µm). In the 1st ground part 141-2, a length L110-2 of a part facing the 1st extension part 131-2 is, for example, approximately 130 µm or approximately 150 µm (145 µm to 155 µm). In the 2nd ground part 142-2, a length of a part facing the 2nd extension part 132-2 is also the same.

Figure 14B:
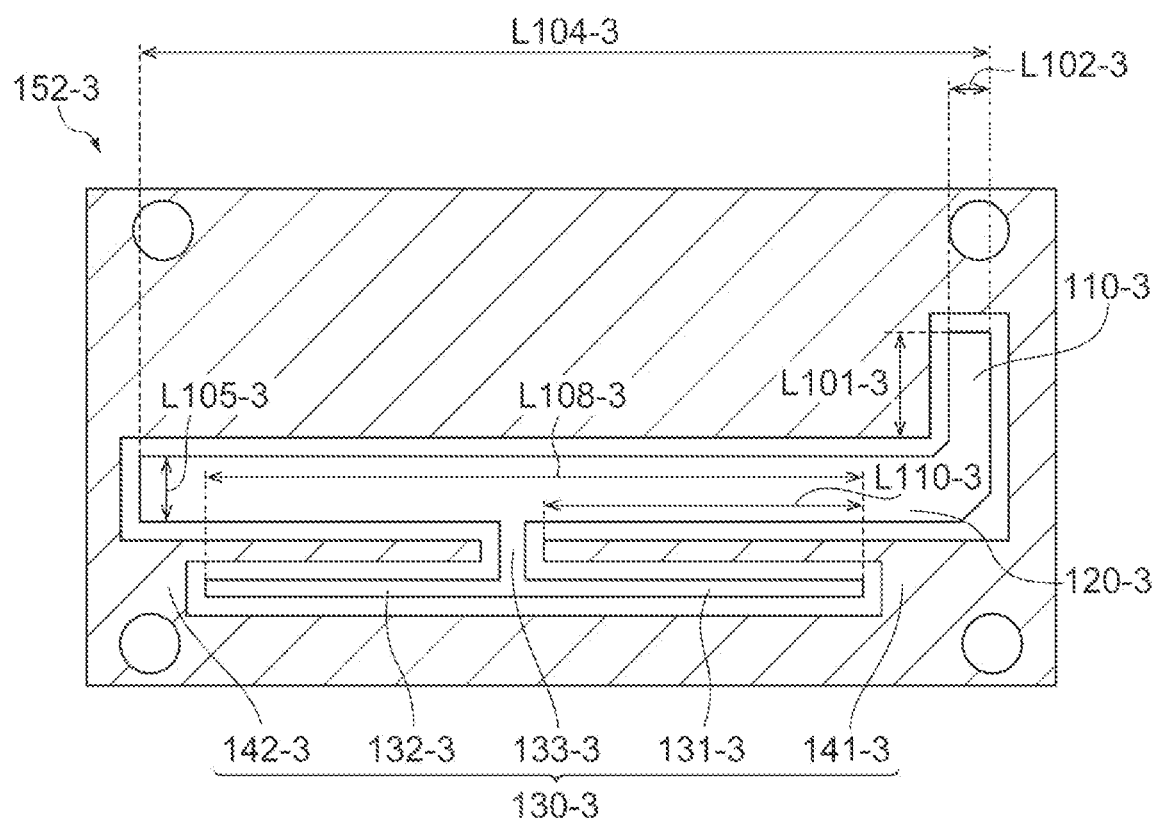
FIG. 14B is a diagram illustrating a variation of the input side signal lines.

In an input side signal line 152-3 illustrated in FIG. 14B, a 1st signal line 110-3 and a 2nd signal line 120-3 are connected in an L shape (bent). A line length (a length L101-3) of the 1st signal line 110-3 is, for example, approximately 240 µm. A line width (a length L102-3) of the 1st signal line is, for example, approximately 70 µm. A line length (a length L104-3) of the 2nd signal line is, for example, approximately 1000 µm. A line width (a length L105-3) of the 2nd signal line is, for example, approximately 240 µm. A capacitor 130-3 is provided on one side of the 2nd signal line 120-3. In the capacitor 130-3, a length L108-3 of a part formed by the 1st extension part 131-3, the 2nd extension part 132-3 and the base part 133-3 in the longitudinal direction of the 2nd signal line 120-3 is, for example, 630 µm (620 µm to 640 µm). In the 1st ground part 141-3, a length L110-3 of a part facing the 1st extension part 131-3 is, for example, approximately 300 µm (290 µm to 310 µm). In the 2nd ground part 142-3, a length of a part facing the 2nd extension part 132-3 is also the same.

Figure 15A:
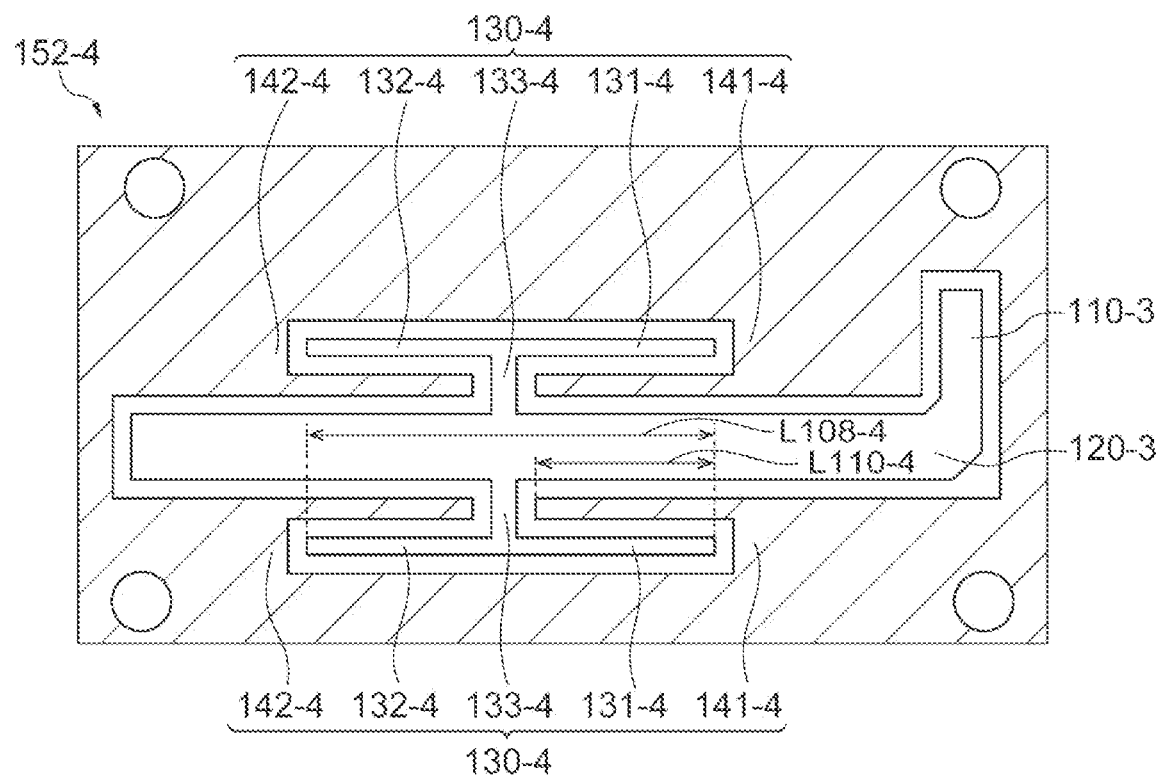
FIG. 15A is a diagram illustrating a variation of the input side signal lines.
Figure 15B:
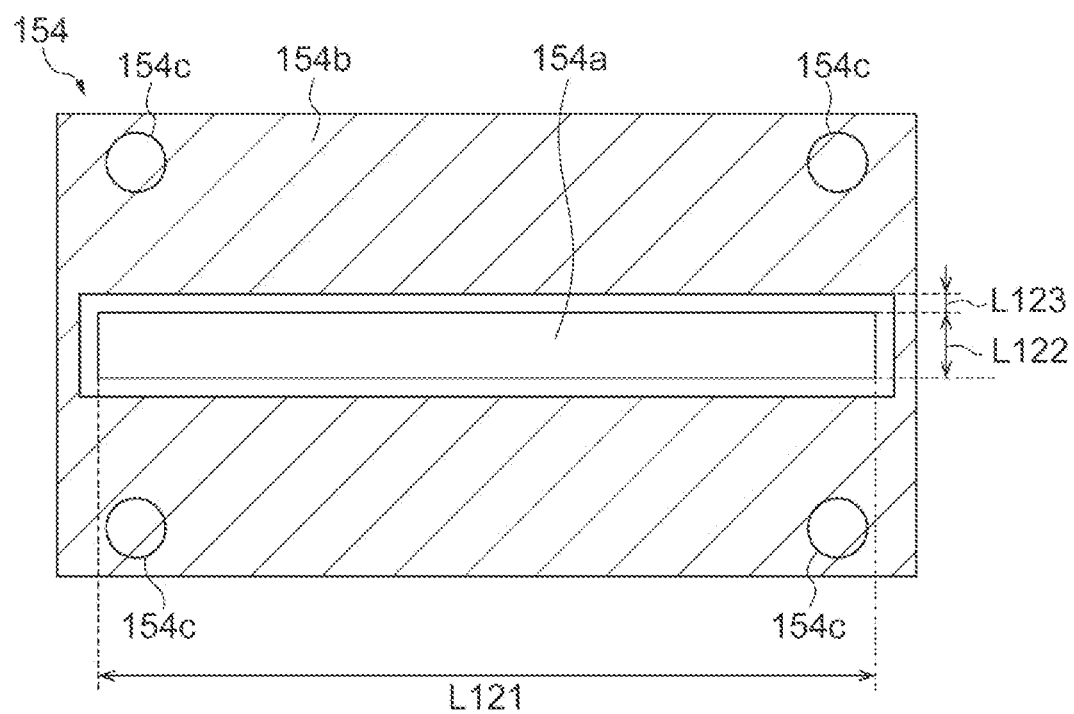
FIG. 15B is an enlarged view of output side signal lines.

An input side signal line 152-4 illustrated in FIG. 15A includes a 1st signal line 110-3 and a 2nd signal line 120-3 connected in an L shape similarly to FIG. 14B. In addition, a capacitor 130-4 is provided on both sides of the 2nd signal line 120-3. In the capacitor 130-4 illustrated in FIG. 15A, a length L108-4 of part formed by the 1st extension part 131-4, the 2nd extension part 132-4 and the base part 133-4 in the longitudinal direction of the 2nd signal line 120-3 is, for example, approximately 310 µm or approximately 320 µm (295 µm to 340 µm). In the 1st ground part 141-4, a length L110-4 of a part facing the 1st extension part 131-4 is, for example, approximately 130 µm or approximately 150 µm (145 µm to 160 µm). In the 2nd ground part 142-4, a length of a part facing the 2nd extension part 132-4 is also the same.

With the input side signal lines 152-2, 152-3 and 152-4 illustrated in FIG. 14A, FIG. 14B, and FIG. 15A described above, similarly to the input side signal line 152 (FIG. 11), the impedance matching can be realized in a wide band. When the transistor chip 153 is an FET, even if the connection between the 1st signal line and the 2nd signal line are connected in a straight line (FIG. 11 and FIG. 14A), or connected in a bent shape (FIG. 14B and FIG. 15A), since the length of the wire 161 between the 1st signal line and the transistor chip 153 does not change, the impedance matching can be obtained.

FIG. 15A is an enlarged view of the output side signal line 154 (FIG. 10). In the output side signal line 154, a signal line 154a is formed on the aluminum substrate. A thickness of the substrate, a material of the metal pattern, and the like may be the same as those of the input side signal line 152 (FIG. 11) described above unless otherwise specified. The signal line 154a is a coplanar line using a ground pattern 154b. The ground pattern 154b is connected to the ground via a via hole 154c to have a reference potential. A line length (a length L121) of the output side signal line 154 is, for example, approximately 1050 µm. A line width (a length L122) of the signal line 154a is, for example, approximately 240 µm. A distance (a length L123) between the signal line 154a and the ground pattern 154b is, for example, uniform and approximately 30 µm. An inner diameter of the via hole 154c is, for example, approximately 80 µm.

Figure 16:
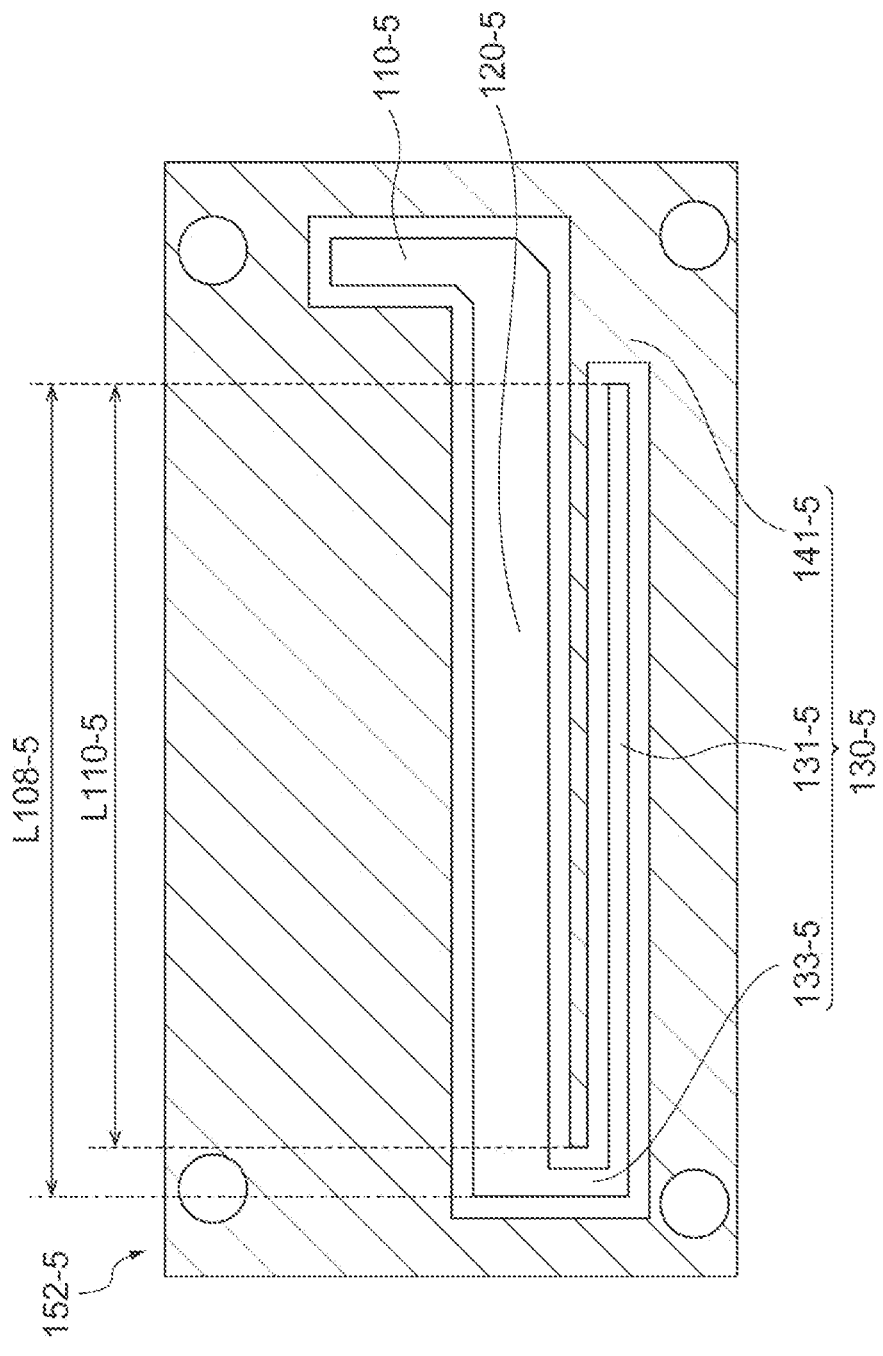
FIG. 16 is a diagram illustrating a variation of the input side signal lines.

A further variation of the input signal line will be described with reference to FIG. 16. An input signal line 152-5 illustrated in FIG. 16 also includes the 1st signal line 110-5 and the 2nd signal line 120-5 and the capacitor 130-5 as described above. The dimensions of the 1st signal line 110-5 and the 2nd signal line 120-5 may be the same dimensions of the corresponding parts of the 1st signal line 110-3 and the 2nd signal line 120-3 described above with reference to FIG. 14B. In the input signal line 152-5, the capacitor 130-5 is connected to the end part of the 2nd signal line 120-3. In this example, the capacitor 130-5 is connected to the input side end part of the 2nd signal line 120-3. The capacitor 130-5 includes a 1st extension part 131-5, a base part 133-5, and a 1st ground part 141-5. In the capacitor 130-5, a length L108-5 of a part formed by the 1st extension part 131-5 and the base part 133-5 in the longitudinal direction of the 2nd signal line 120-3 is, for example, approximately 800 μm (approximately 700 μm to 900 μm). In the 1st ground part 141-5, a length L110-5 of a part facing the 1st extension part 131-5 is, for example, approximately 200 μm. The lengths of other parts (the lengths corresponding to the length L109, L111 to L114 of the capacitor 130 in FIG. 11) may be the same as the corresponding part of the capacitor 130.

Figure 17A:
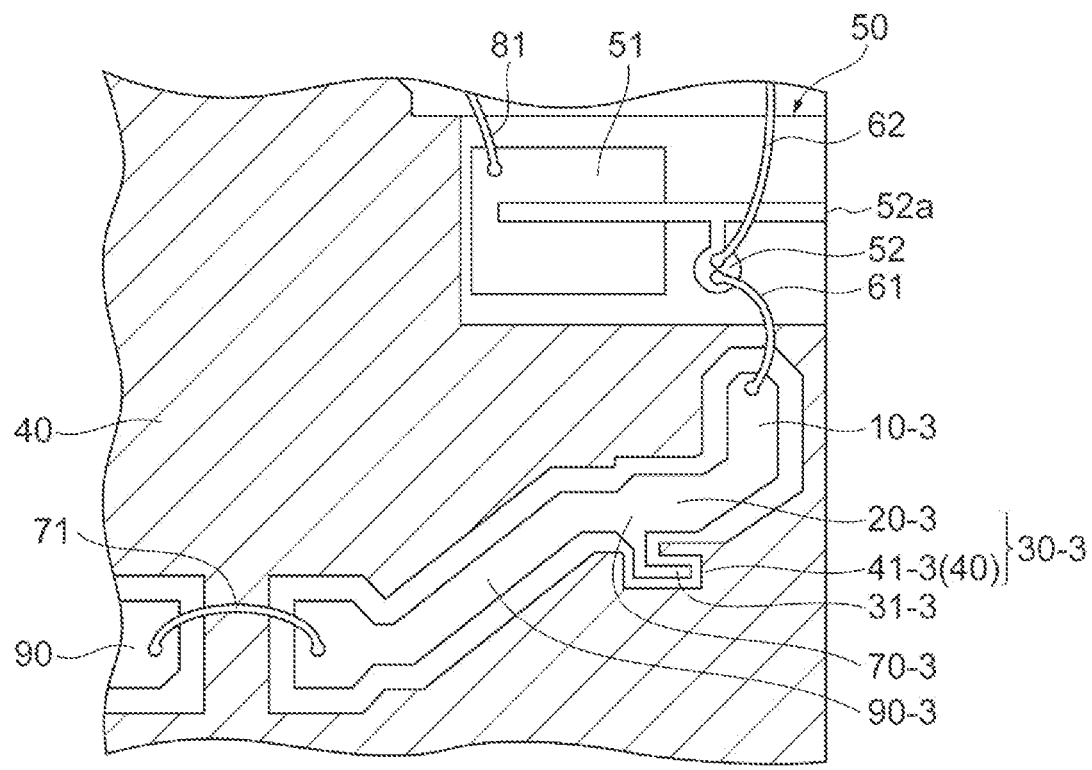
FIG. 17A is a diagram illustrating a variation of the signal lines and the capacitors in FIG. 1.

In the above description, an example of impedance matching when the upper limit frequency of the frequency band is approximately 23 GHz has been described. On the other hand, in a case of a higher frequency band (a short wavelength band), the impedance matching can be realized by reducing the dimension (by shortening the length) of the signal line and the capacitor. FIG. 17A is a diagram illustrating a variation of the signal lines and the capacitors in order for such an impedance matching. Dimensions of a 1st signal line 10-3, a 2nd signal line 20-3 and a capacitor 30-3 illustrated in FIG. 17A are smaller than the dimensions of the 1st signal line 10, the 2nd signal line 20 and the capacitor 30 illustrated in FIG. 1. A transmission line 90-3 connects an input terminal 70-3 connected to a 2nd signal line 20-3, and the transmission line 90 and the wire 71. The impedance of the transmission line 90-3 may be the same as the impedance of the transmission line 90.

Figure 17B:
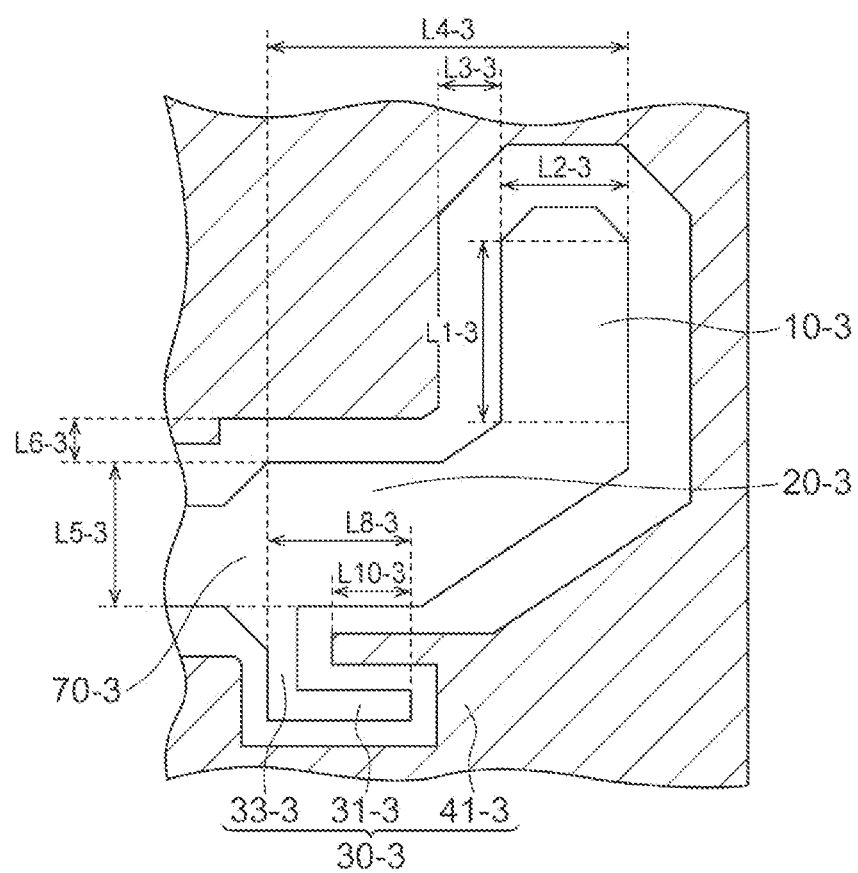
FIG. 17B is an enlarged view of the signal lines and the capacitors and the surroundings thereof.

FIG. 17B is an enlarged view of the signal line and capacitor illustrated in FIG. 17A and the surroundings thereof. An example of the dimensions will be described below. The dimension example described here is to realize the impedance matching in the frequency band approximate 25 GHz to 40 GHz range. In other frequency bands, other dimensions may be adopted. In this example, the capacitor 30-3 is connected to the input side end part of the 2nd signal line 20-3.

A line length (a length L1-3) of the 1st signal line 10-3 is 100 μm, a line width (a length L2-3) is 70 μm, and a slot width (a length L3-3) is 40 μm. A line length (a length L4-3) of the 2nd signal line 20-3 is 190 μm, a line width (a length L5-3) is 100 μm and a slot width (a length L6-3) is 40 μm. In the capacitor 30-3, a length L8-3 of a part formed by the 1st extension part 31-3 and the base part 33-3 in the longitudinal direction of the 2nd signal line 20-3 is 80 μm. In the ground part 41-3, a length L10-3 of a part facing the 1st extension part 31-3 is 40 μm. Other dimensions of the other capacitor 30-3 (the dimensions of the parts corresponding to the lengths L9, L11 to L14 in FIG. 3) may be the same as those described above with reference to FIG. 3 (for example, 20 μm). As described above, the line length (length L1-3) of the 1st signal line 10-3 and the line length (the length L4-3) of the 2nd signal line 20-3 illustrated in FIG. 17B can be physically shorter than the line length (the length L1) of the 1st signal line 10 and the line length (the length L4) of the 2nd signal line 20. The lengths (the length L8-3) of the capacitor 30-3 illustrated in FIG. 17B can also be physically shorter than the length (length L8) of the capacitor 30 illustrated in FIG. 1. Regarding the position of the capacitor 30, depending on the matching condition, the capacitor 30 may be provided on the input side end part of the 2nd signal line 20-3 as illustrated in FIG. 17B.

According to the 1st signal line 10-3, the 2nd signal line 20-3, and the capacitor 30-3 having the above-described dimensions, the impedance matching is realized even in a significantly high frequency band such as a frequency band of approximately 25 GHz to 40 GHz. That is, similarly to the case described above with reference to FIG. 5 and FIG. 6, the Impedance (S11) seen from the input terminal is positioned close to the center of the Smith chart, and the magnitude of S11 becomes small as a whole.

The above-described embodiments and the variations may be appropriately combined. For example, the input side signal lines 152-2, 152-3, 152-4 and 152-5 described with reference to FIGS. 14A, 14B, 15A and 16 may be respectively used as the 1st signal line 10, the 2nd signal line 20, and the capacitor 30 in the embodiment described above with reference to FIG. 3 and the like. The 1st signal line 10-3, the 2nd signal line 20-3 and the capacitor 30-3 described with reference to FIG. 17A and FIG. 17B may be used as the input side signal line 152 in FIG. 11.

REFERENCE SIGNS LIST

1, 101 . . . semiconductor device, 10, 110 . . . 1st signal line, 20, 120 . . . 2nd signal line, 30, 130 . . . capacitor, 31, 131 . . . 1st extension part (1st metal pattern), 32, 132 . . . 2nd extension part (2nd metal pattern), 40, 140 . . . ground pattern, 41, 141 . . . 1st ground part (1st metal pattern), 42, 142 . . . 2nd ground part (2nd metal pattern), 50 . . . semiconductor element, 70, 170 . . . input terminal, 153 . . . transistor chip (semiconductor element)

The invention claimed is:

1. A semiconductor device comprising:
    an insulation substrate provided with a ground pattern having a reference potential;
    a semiconductor element provided on the insulation substrate;
    an input terminal provided on the insulation substrate and to which an electric signal to be supplied to the semiconductor element is input;
    a 1st signal line electrically connected between the semiconductor element and the input terminal, and provided on the insulation substrate;
    a 2nd signal line electrically connected between the 1st signal line and the input terminal, and provided on the insulation substrate; and
    a capacitor connected to the 2nd signal line and provided on the insulation substrate,
    wherein the 2nd signal line has impedance lower than impedance of the 1st signal line,
    wherein the capacitor includes
       a 1st metal pattern provided on the insulation substrate so as to connect to the 2nd signal line and extend along a longitudinal direction of the 2nd signal line, and
       a 2nd metal pattern which is at least a part of the ground pattern, and is provided between the 1st metal pattern and the 2nd signal line and between the 1st metal pattern and an end part of the insulation substrate, to be electrically coupled with the 1st metal pattern.

2. The semiconductor device according to claim 1,
wherein, in the 2nd metal pattern, a part positioned between the 2nd signal line and the 1st metal pattern is provided to be electrically coupled with the 2nd signal line.

3. The semiconductor device according to claim 1,
wherein the impedance of the 2nd signal line is lower than 50 ohm.

4. The semiconductor device according to claim 1,
wherein the 1st signal line has a constant width in a longitudinal direction.

5. The semiconductor device according to claim 1,
wherein a connection part of the 1st signal line and the 2nd signal line is bent.

6. The semiconductor device according to claim 5,
wherein the 1st signal line and the 2nd signal line are connected in an L shape,
wherein one end of the 1st signal line is connected to the semiconductor element, and an other end of the 1st signal line is connected to the 2nd signal line, and
wherein the semiconductor element is provided on the one end side of the 1st signal line, and the capacitor is provided on the side opposite to the one end side of the 1st signal line across the 2nd signal line.

7. The semiconductor device according to claim 1,
wherein the 1st signal line and the 2nd signal line are coplanar lines using the ground pattern.

8. The semiconductor device according to claim 1,
wherein the capacitor is provided on both sides of the 2nd signal line along the 2nd signal line.

9. A semiconductor device comprising:
a heatsink having an input lead and an output lead,
a semiconductor element provided on the heatsink, and is provided between the input lead and the output lead,
an insulation substrate provided with a ground pattern having a reference potential, the insulation substrate being provided on the heatsink, and being provided between the input lead and the semiconductor element;
an input terminal provided on the insulation substrate and to which an electric signal to be supplied to the semiconductor element is input from the input lead;
a 1st signal line electrically connected between the semiconductor element and the input terminal, and is provided on the insulation substrate;
a 2nd signal line electrically connected between the 1st signal line and the input terminal, and provided on the insulation substrate; and
a capacitor connected to the 2nd signal line and provided on the insulation substrate,
wherein the 2nd signal line has impedance lower than impedance of the 1st signal line,
wherein the capacitor includes
a 1st metal pattern provided on the insulation substrate so as to connect to the 2nd signal line and extend along a longitudinal direction of the 2nd signal line, and
a 2nd metal pattern which is at least a part of the ground pattern, and is provided between the 1st metal pattern and the 2nd signal line and between the 1st metal pattern and an end part of the insulation substrate, to be electrically coupled with the 1st metal pattern.

10. The semiconductor device according to claim 9,
wherein, in the 2nd metal pattern, a part positioned between the 2nd signal line and the 1st metal pattern is provided to be electrically coupled with the 2nd signal line.

11. The semiconductor device according to claim 9,
wherein the impedance of the 2nd signal line is lower than 50 ohm.

12. The semiconductor device according to claim 9,
wherein the 1st signal line has a constant width in a longitudinal direction.

13. The semiconductor device according to claim 9,
wherein a connection part of the 1st signal line and the 2nd signal line is bent.

14. The semiconductor device according to claim 13,
wherein the 1st signal line and the 2nd signal line are connected in an L shape,
wherein one end of the 1st signal line is connected to the semiconductor element, and an other end of the 1st signal line is connected to the 2nd signal line, and
wherein the semiconductor element is provided on the one end side of the 1st signal line, and the capacitor is provided on the side opposite to the one end side of the 1st signal line across the 2nd signal line.

15. The semiconductor device according to claim 9,
wherein the 1st signal line and the 2nd signal line are coplanar lines using the ground pattern.

16. The semiconductor device according to claim 9,
wherein the capacitor is provided on both sides of the 2nd signal line along the 2nd signal line.

* * * * *